(12) United States Patent
Ota

(10) Patent No.: US 8,941,209 B2
(45) Date of Patent: Jan. 27, 2015

(54) SEMICONDUCTOR DEVICE

(71) Applicant: Elpida Memory, Inc., Tokyo (JP)

(72) Inventor: Yohei Ota, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/897,739

(22) Filed: May 20, 2013

(65) Prior Publication Data

US 2013/0328160 A1 Dec. 12, 2013

(30) Foreign Application Priority Data

Jun. 6, 2012 (JP) ................. 2012-128828

(51) Int. Cl.
*H01L 21/70* (2006.01)
*H01L 27/04* (2006.01)
*H01L 27/108* (2006.01)

(52) U.S. Cl.
CPC .......... *H01L 27/04* (2013.01); *H01L 27/10891* (2013.01); *H01L 27/10894* (2013.01); *H01L 27/10897* (2013.01); *H01L 27/10855* (2013.01)
USPC ...................................... 257/506

(58) Field of Classification Search
CPC ............... H01L 21/823808; H01L 21/823814; H01L 29/7843; H01L 21/6224
USPC ......... 438/218, 221, 225, 238, 381, 386, 424, 438/425, 427, 438; 257/621, 298, 315, 506, 257/306, 216, 296, E21.19, E21.64, 257/E21.294, E21.017, E21.546
See application file for complete search history.

(56) References Cited

U.S. PATENT DOCUMENTS

| | | | | |
|---|---|---|---|---|
| 2002/0005542 | A1* | 1/2002 | Hayano et al. | 257/306 |
| 2006/0226469 | A1* | 10/2006 | Nakagawa | 257/315 |
| 2009/0309147 | A1* | 12/2009 | Kim et al. | 257/298 |
| 2011/0186968 | A1* | 8/2011 | Kishida | 257/621 |
| 2012/0100678 | A1* | 4/2012 | Sako et al. | 438/197 |

FOREIGN PATENT DOCUMENTS

JP 2011-159739 8/2011

* cited by examiner

*Primary Examiner* — Amar Movva
*Assistant Examiner* — Sheikh Maruf
(74) *Attorney, Agent, or Firm* — Young & Thompson

(57) ABSTRACT

Semiconductor device comprises a memory cell region, a peripheral region, and first wiring. The memory cell region includes a first isolation region, and a first active region provided so as to be divided off by the first isolation region. The peripheral region includes a second isolation region, and a second active region divided off by the first and second isolation regions and protruding from the upper surface of an insulating film located in the first and second isolation regions. The first wiring is buried in portions of a semiconductor substrate within the memory cell region and the peripheral region, so as to extend over the first and second active regions in a first direction. The first-direction width of the second active region is constant.

16 Claims, 30 Drawing Sheets

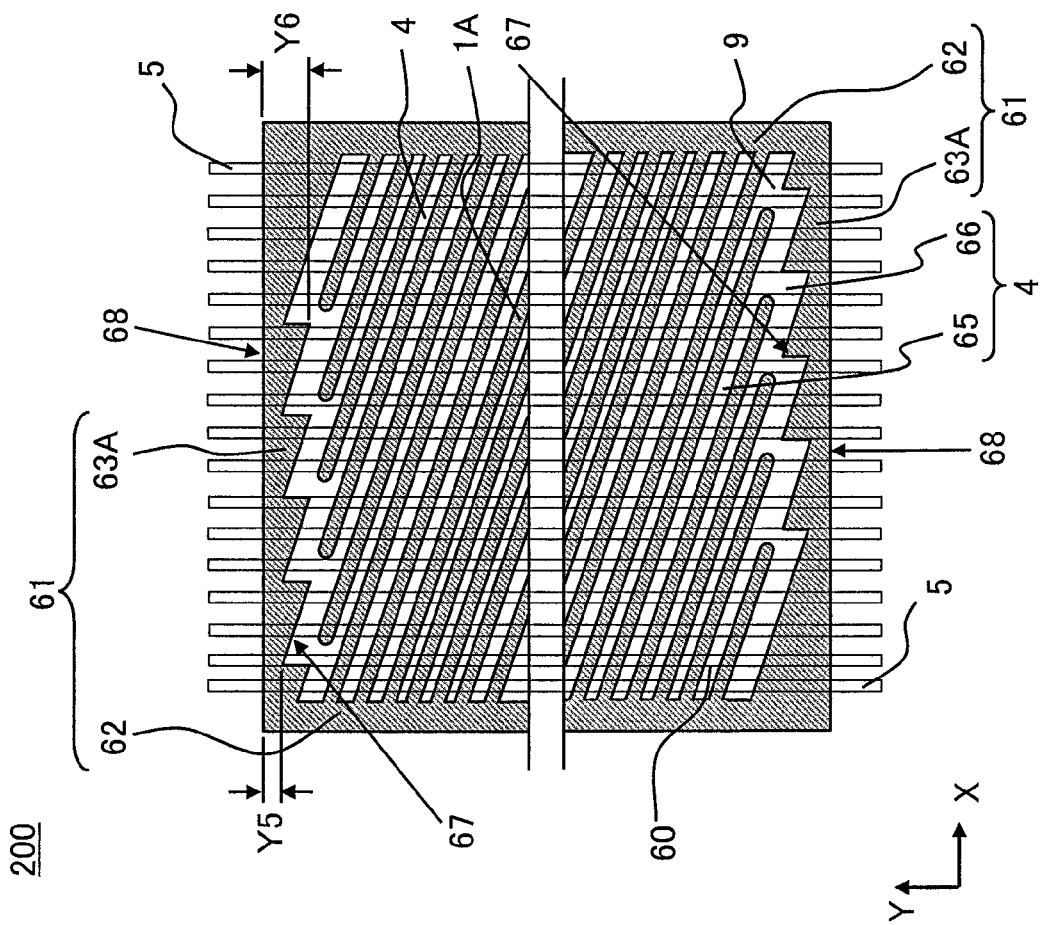
FIG.26 "Related Art"

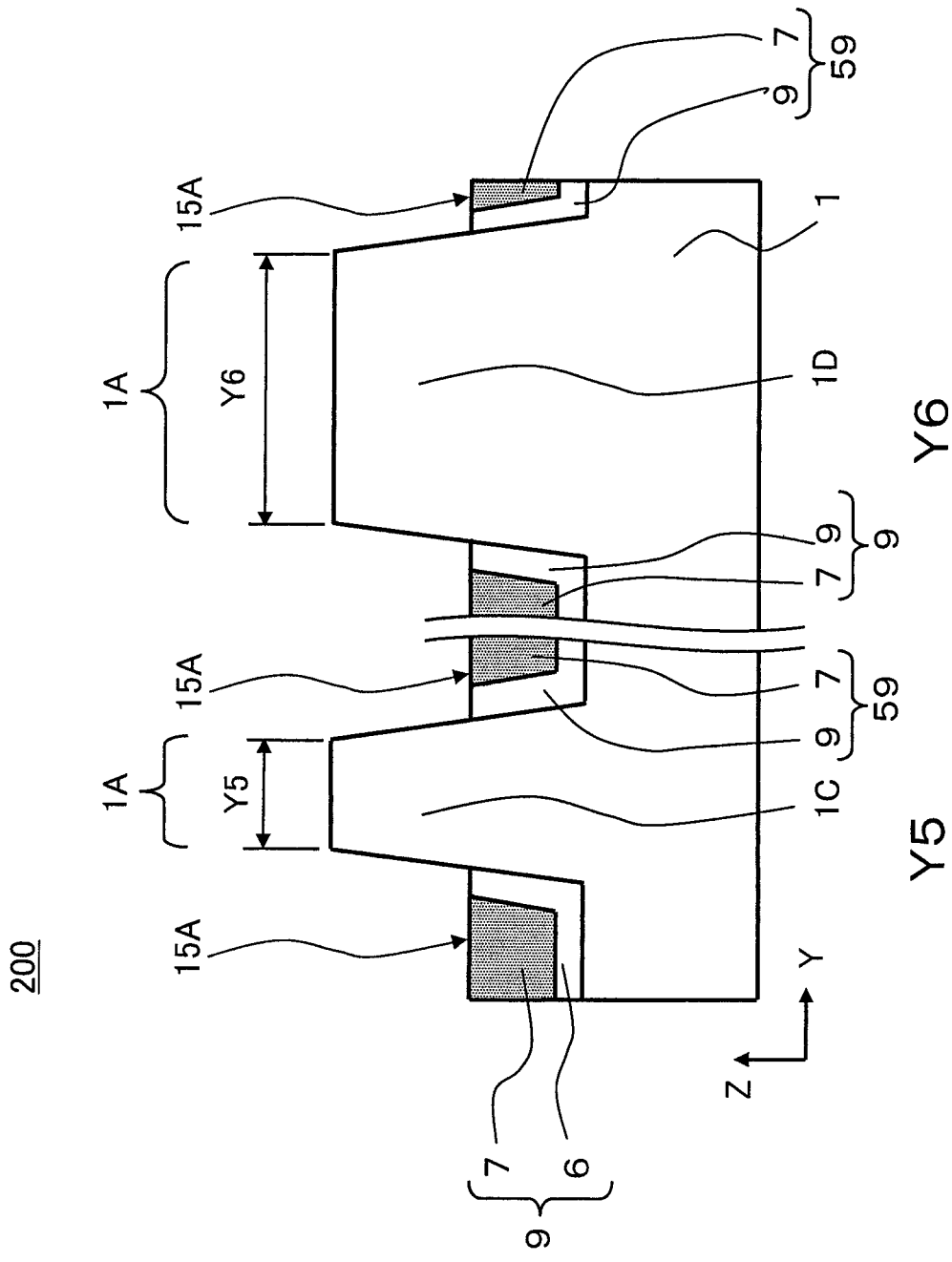
FIG.27 "Related Art"

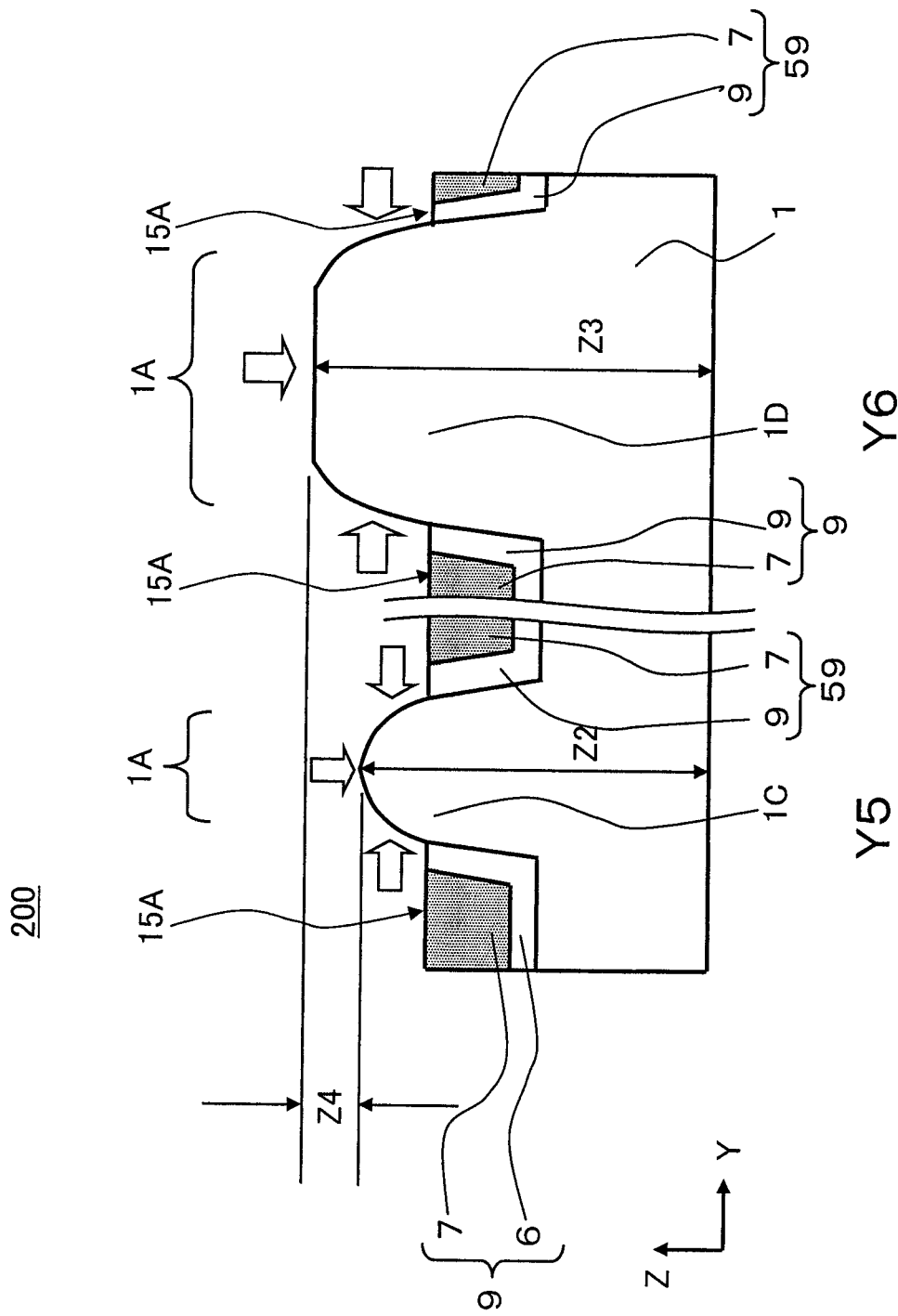
FIG.28 "Related Art"

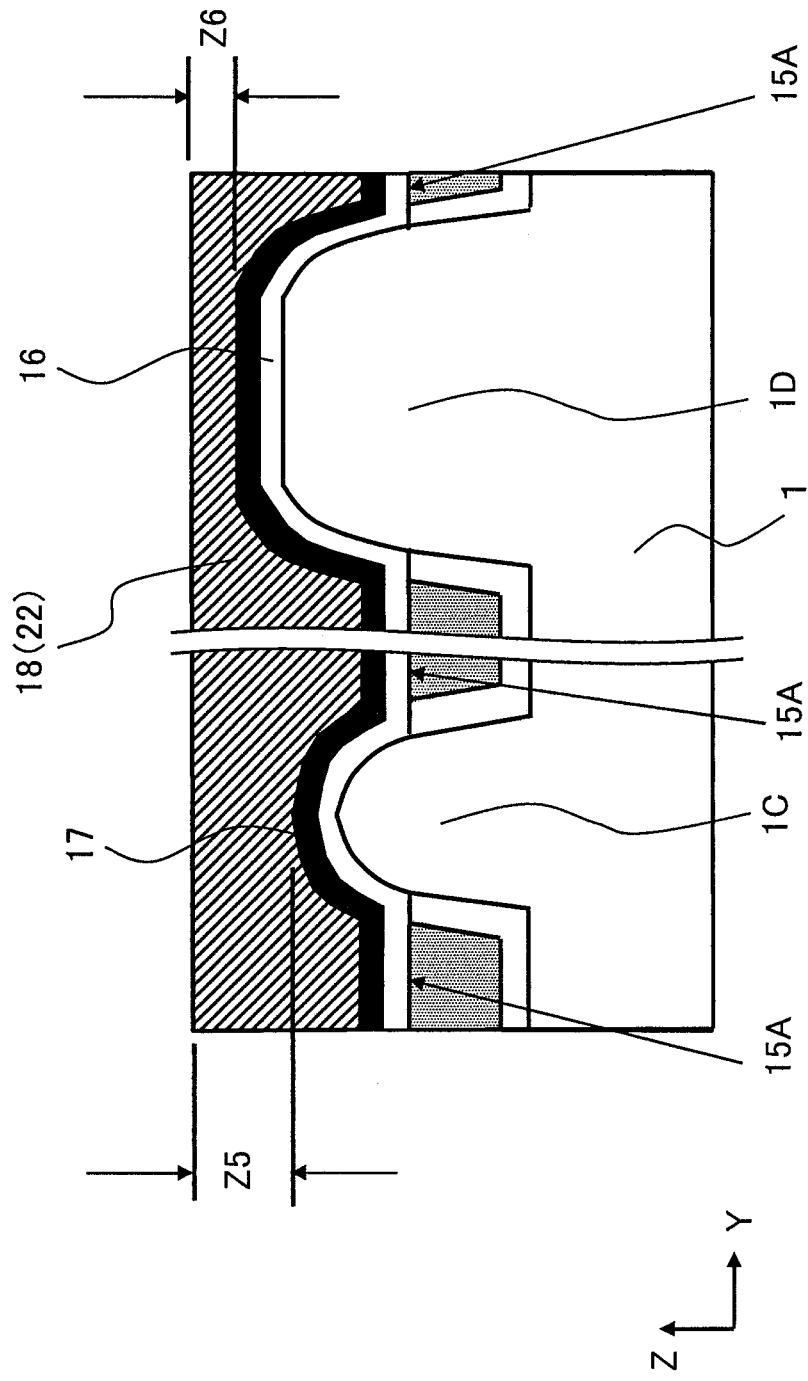
FIG. 29 "Related Art"

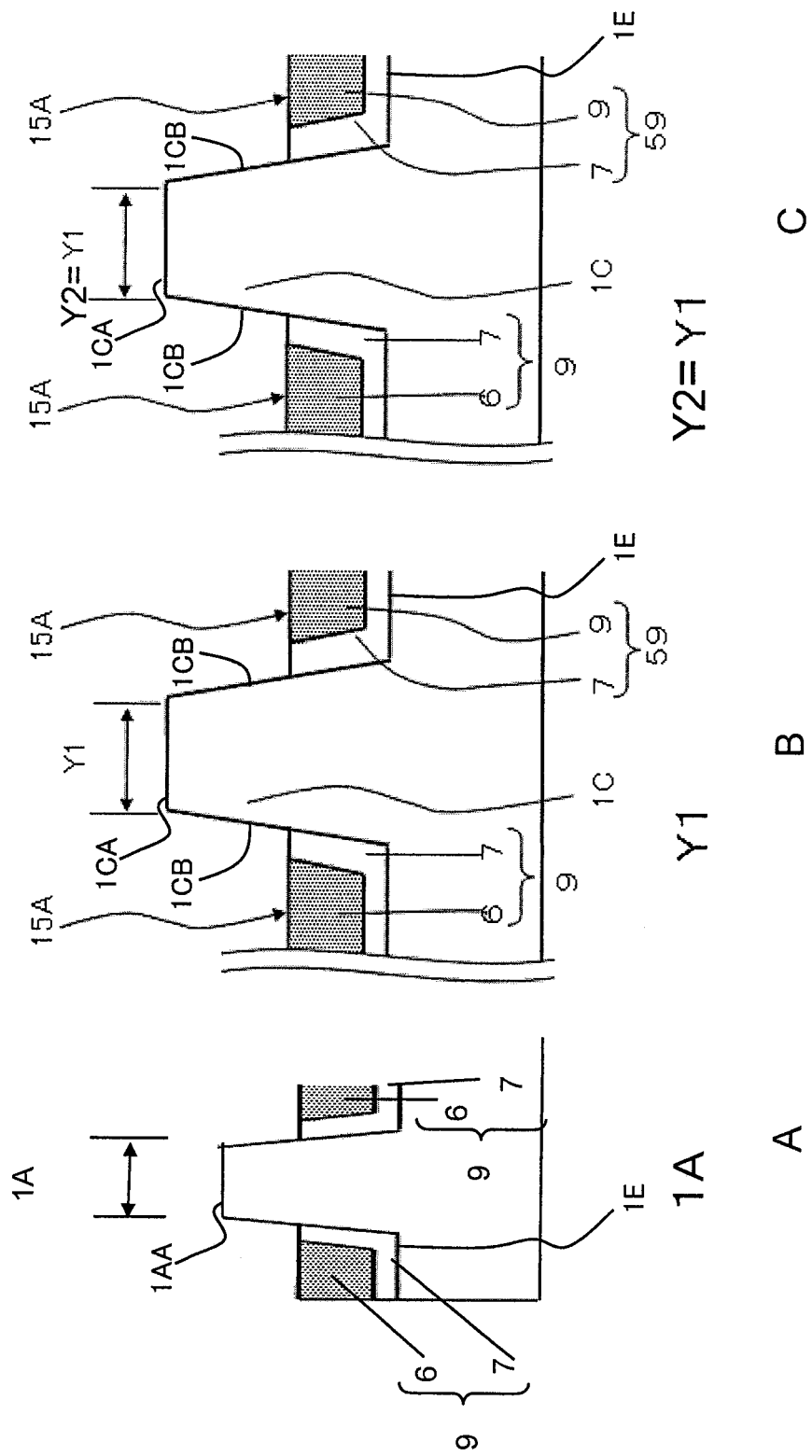

SEMICONDUCTOR DEVICE

This application is based upon and claims the benefit of priority from Japanese Patent Application No. 2012-128828 filed on Jun. 6, 2012, the disclosure of which are incorporated herein in its entirety by reference.

BACKGROUND OF THE INVENTION

1. Field of the Invention

The present invention relates to a semiconductor device.

2. Description of the Related Art

Conventionally, there has been used a semiconductor device including an isolation region (STI: Shallow Trench Isolation) structure formed by burying an insulating film in a trench provided in a semiconductor substrate. In this semiconductor device, a region divided off by the STI structure serves as an active region. In addition, there has been conventionally used a method for forming trenches for burying gates in a semiconductor substrate, in addition to STI trenches, and burying gate electrodes in the trenches, in order to optimize the gate length of a transistor.

JP2011-159739A discloses a semiconductor device in which an active region isolated by STI is formed, and a gate electrode is formed as buried wiring. Paragraph 0014 of JP2011-159739A discloses that burial failures, such as voids, are liable to occur inside an insulating film buried in linear trench portion 401 in the vicinity of wide connection trench 402. As measures against these failures, JP2011-159739A discloses forming the planar shape of an isolation trench into a shape small in width variation in the method described in the patent document (paragraph 0020). In addition, JP2011-159739A discloses, in FIG. 30 thereof, a peripheral region which exists so as to surround a memory cell region and protrudes toward the memory cell region side at the boundary thereof with the peripheral region.

FIG. 26 is a schematic plan view illustrating the layout of isolation regions, element-forming regions (hereinafter, described as active regions in some cases), and buried wiring of DRAM 200 according to the related art, where intermediate parts are excluded from the illustration. DRAM 200 includes memory cell region 60, and peripheral region 61 in which driving transistors (not illustrated) are disposed outside memory cell region 60. Peripheral region 61 is composed of isolation region (STI) 59, Y peripheral region 62 extending in a Y direction, and X peripheral region 63A extending in an X direction. Element isolation trench 4 which defines the planar shape of STI 9 includes a plurality of linear trench portions 65 extending in a direction intersecting with the Y direction, and crank-shaped trench portions 66 sandwiched between a plurality of active regions 1A located on the Y-direction edge side of memory cell region 60 and X peripheral region 63A. Here, one boundary portion 67 of X peripheral region 63A in DRAM 200 has a crank shape, whereas the other boundary portion 68 has a linear shape. Consequently, the Y-direction width of X peripheral region 63A has a minimum value of Y5 and a maximum value of Y6.

In this DRAM 200, silicon in active regions composing X peripheral region 63A is simultaneously dry-etched along with STI 9 when forming trenches for buried wiring 5 composed of gate electrodes. At this time, the side etching of each active region progresses further with a decrease in the width of each active region. Thus, side etching reaches as far as the central portion of the active region. As a result, etching from the upper surface of the active region is accelerated. Accordingly, a narrow active region becomes smaller in height than an active region which is so wide that side etching does not reach the central part of the active region.

In such DRAM 200 of the related art as illustrated in FIG. 26, the Y-direction width of X peripheral region 63A varies from the minimum value Y5 to the maximum value Y6, thus causing a variation in the amount of side etching at the time of forming trenches for gate electrode 5 on the X peripheral region 63A. As a result, the height of active regions composing X peripheral region 63A (the height of the upper surfaces of the active regions composing the bottoms of trenches for gate electrode 5) also varies. The present inventors have found that if gate electrode 5 is buried in the trenches under this condition, the film thickness of gate electrode 5 also varies, thus causing a variation in the wiring resistance of gate electrode 5.

SUMMARY

In one embodiment, there is provided a semiconductor device comprising:
  a memory cell region including a first isolation region, and a first active region provided so as to be divided off by the first isolation region;
  a peripheral region including a second isolation region, and a second active region divided off by the first and second isolation regions and protruding from an upper surface of an insulating film located in the first and second isolation regions; and
  a first wiring buried in portions of a semiconductor substrate within the memory cell region and the peripheral region, so as to extend over the first and second active regions in a first direction,
  wherein a width of the second active region in the first direction is constant.

In another embodiment, there is provided a semiconductor device comprising:
  a memory cell region including a first isolation region, and a first active region provided so as to be divided off by the first isolation region;
  a peripheral region including a second isolation region, and a second active region protruding from an upper surface of an insulating film located in the first and second isolation regions; and
  a first wiring buried in portions of a semiconductor substrate within the memory cell region and the peripheral region, so as to extend over the first and second active regions in a first direction,
  wherein the second active region is arranged so as to have contact with the first and second isolation regions through part of a side surface of the second active region and so as to surround the memory cell region, and
  a width of part of the second active region intersecting with the first wiring is constant.

In another embodiment, there is provided a semiconductor device comprising:
  a memory cell region including a plurality of cell isolation regions which are provided in a semiconductor substrate and extend in a second direction, the cell isolation regions being formed by burying an insulating film in the semiconductor substrate, and a plurality of cell active regions divided off by the plurality of cell isolation regions and extending in the second direction;
  a peripheral region including a peripheral active region surrounding the memory cell region, and a peripheral isolation region arranged in contact with the peripheral active region outside the memory cell region, the peripheral isolation region including the insulating film; and a plurality of buried word lines which intersect with the plurality of cell active regions and the peripheral active region and extend in a first direction, the plurality of buried word lines being formed by burying a metal layer in the semiconductor substrate, wherein the plurality of cell active regions and the peripheral active region protrude from an upper surface of the insulating film, a width of the peripheral active region in the first direction is constant, and a plan-view area of a region in which each of the buried word lines and the peripheral active region intersect with each other is larger than a plan-view area of a region in which each of the buried word lines and each of the plurality of cell active regions intersect with each other.

BRIEF DESCRIPTION OF THE DRAWINGS

The above features and advantages of the present invention will be more apparent from the following description of certain preferred embodiments taken in conjunction with the accompanying drawings, in which:

FIG. 26 is a plan view illustrating a memory cell region and a peripheral region in a related semiconductor device;

FIG. 27 is a cross-sectional view used to describe problems in the related semiconductor device;

FIG. 28 is another cross-sectional view used to describe problems in the related semiconductor device;

FIG. 29 is yet another cross-sectional view used to describe problems in the related semiconductor device; and FIG. 30A is a cross-sectional view illustrating active region, and FIGS. 30B and 30C are cross-sectionals views illustrating X peripheral regions in one exemplary embodiment of the semiconductor device.

Figure 1:
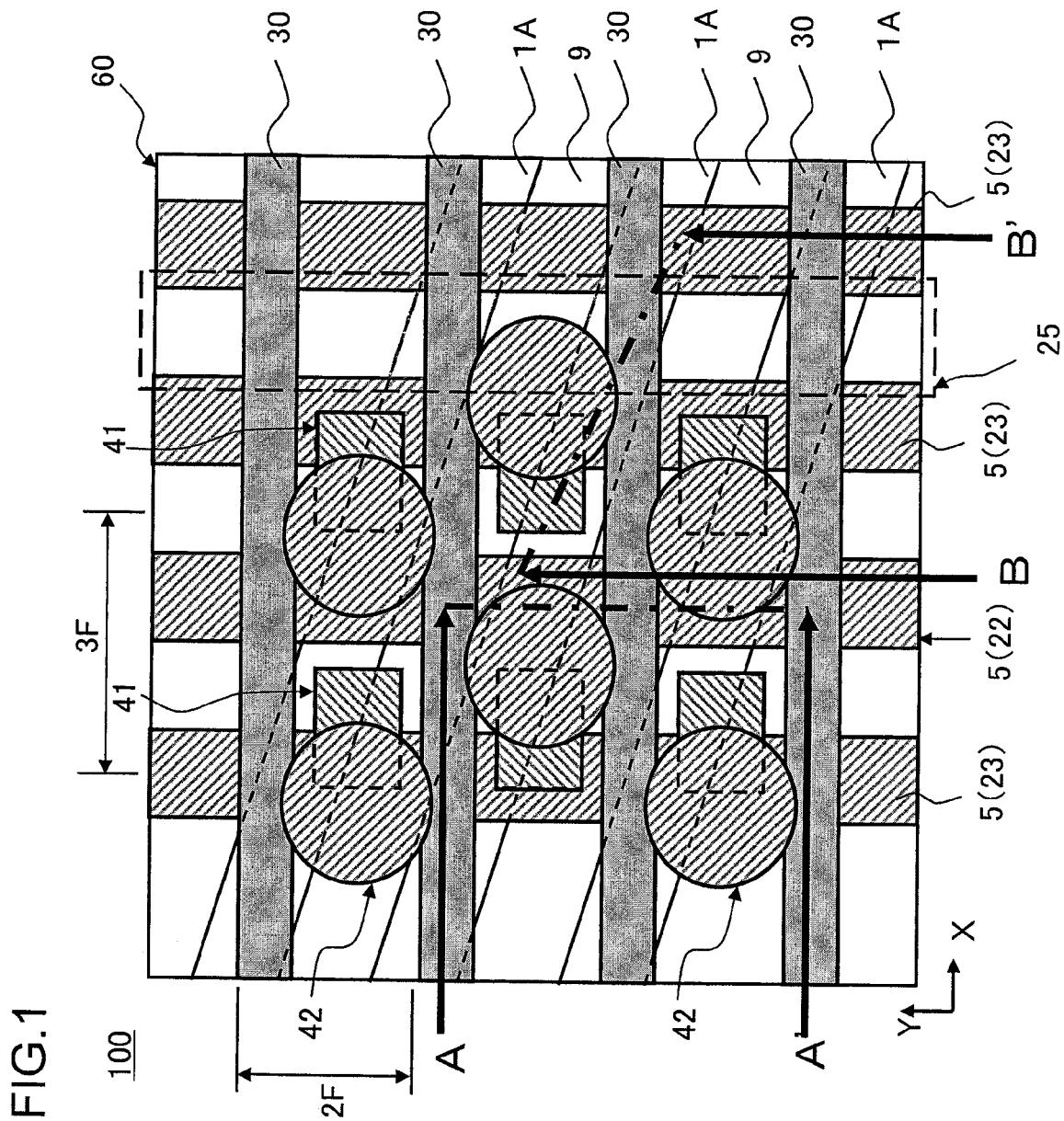
FIG. 1 is a plan view illustrating a memory cell region in one exemplary embodiment of a semiconductor device.

In the drawings, numerals have the following meanings. 1: silicon substrate, 1A: element-forming region (active region), 1B: silicon protruding part, 1C: silicon protruding part, 1D: silicon protruding part, 2: sacrificial film, 3: mask film, 4: isolation trench, 5: buried wiring, 6: insulating film, 7: insulating film, 8: buried film, 9: first isolation region (STI), 10: sacrificial film, 11: low-concentration impurity-diffused layer, 12: lower-layer mask film, 13: upper-layer mask film, 13A: opening, 15: gate electrode trench, 15A: hole, 16: gate insulating film, 17: interposer layer, 18: conductive film, 18A: conductive film, 20: liner film, 21: buried insulating film, 22: buried wiring for isolation, 23: buried word line, 24: first interlayer insulating film, 25: bit contact opening, 26: first impurity-diffused layer, 27: conductive film, 28: conductive film, 29: mask film, 30: bit line, 31: insulating film, 32: liner film, 33: SOD film, 34: second interlayer insulating film, 35: capacitor contact opening, 36: sidewall insulating film, 37: second impurity-diffused layer, 38: conductive film, 39: interposer layer, 40: conductive film, 41: capacitor contact plug, 42: capacitor contact pad, 43: stopper film, 44: third interlayer insulating film, 44A: cylinder hole, 45: lower electrode, 46: capacitor insulating film, 47: upper electrode, 48: capacitor, 49: fourth interlayer insulating film, 50: contact plug, 51: upper metal wiring, 52: protective film, 55: edge portion of first active region, 56: boundary portion, 59: second isolation region (STI), 60: memory cell region, 61: peripheral region, 62: Y peripheral region, 63: X peripheral region, 63A: X peripheral region, 64: unit pattern, 65: linear trench portion, 66: crank-shaped trench portion, 67, 68:
boundary portion, 100: DRAM, and 200: DRAM.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The configuration of a semiconductor device in the present exemplary embodiment will be described by citing a case in which the semiconductor device is a DRAM (Dynamic Random Access Memory). Note that in the description given hereinafter, a first direction is referred to as a Y direction, a second direction intersecting with the first direction is referred to as an X' direction, and a third direction is referred to as an X direction. As described later with reference to FIG. 25, the third direction (X direction) is substantially perpendicular to the first direction (Y direction). The second direction (X' direction) slopes from the third direction, and an angle between the first direction and second direction is an acute angle.

In addition, a first active region and cell active region is referred to as active region 1A within memory cell region 60, and a second active region is referred to as X peripheral region 63. Yet additionally, a first isolation region is referred to as isolation region (STI) 9 within memory cell region 60, and a second isolation region and peripheral isolation region is referred to as isolation region (STI) 59 within peripheral region 61. Still additionally, first wiring is referred to as buried wiring 5.

Figure 2:
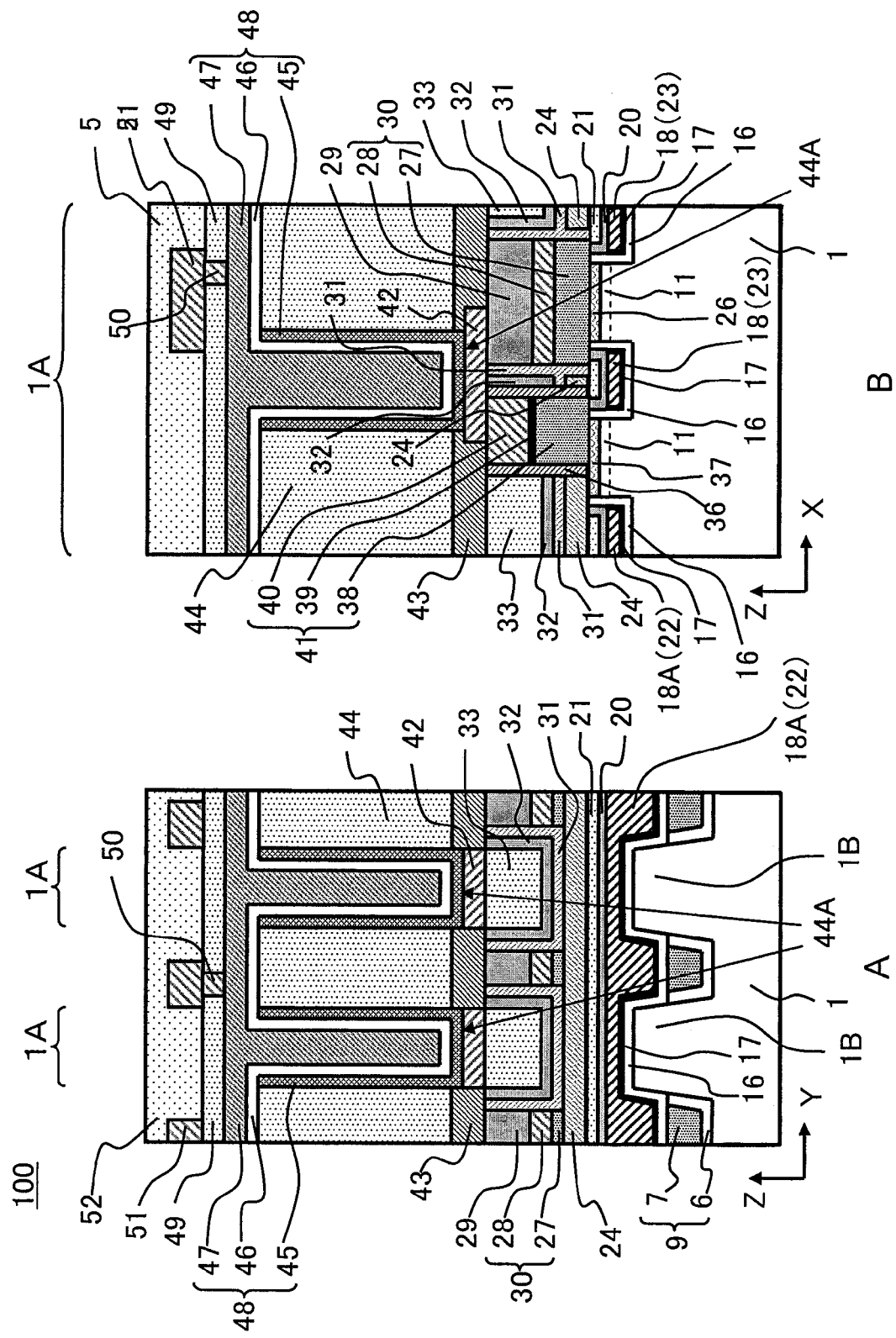
FIGS. 2A and 2B are cross-sectional views taken along the A-A' and B-B' directions of the semiconductor device illustrated in FIG. 1.
Figure 25:
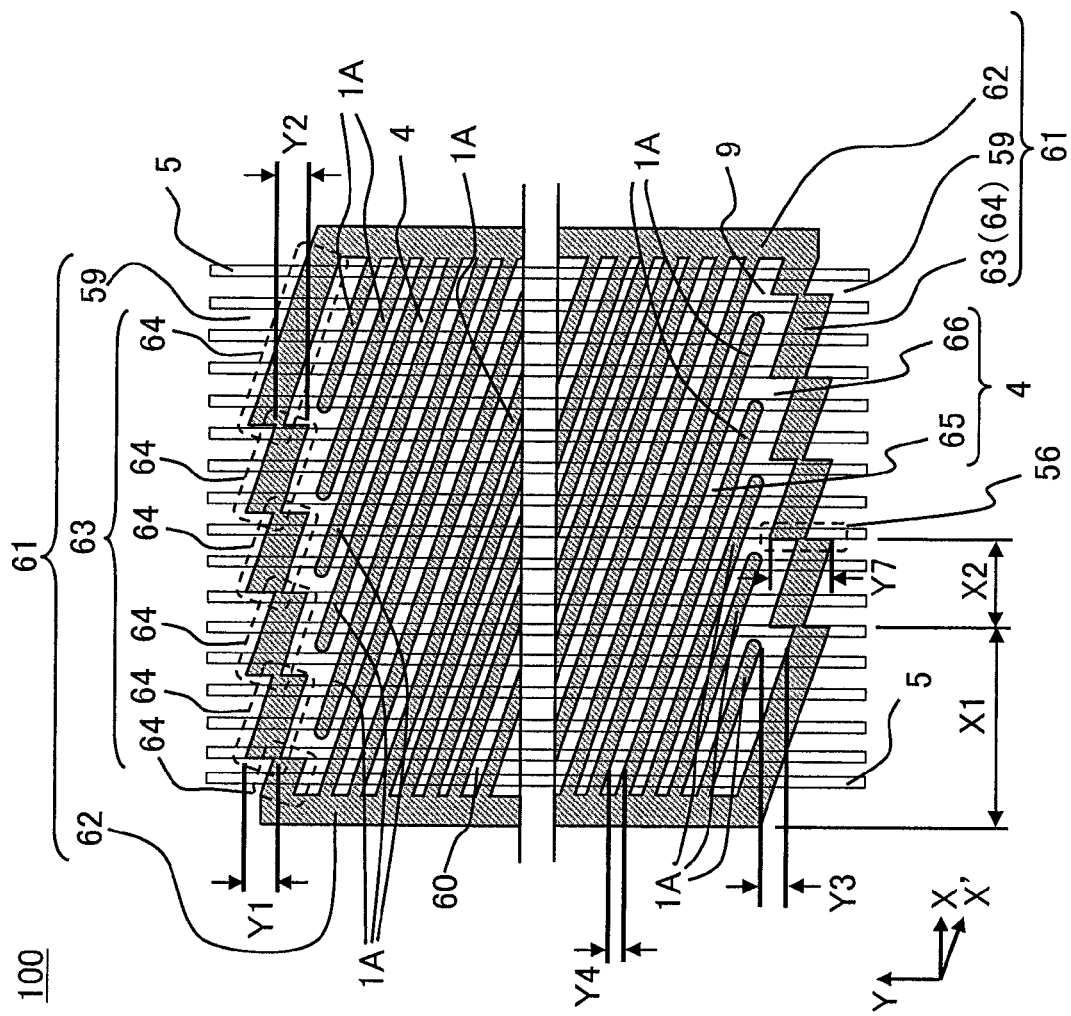
FIG. 25 is a plan view illustrating a memory cell region and a peripheral region in one exemplary embodiment of the semiconductor device.

FIG. 1 is a plan view of the configuration of DRAM 100 according to the present exemplary embodiment, illustrating the memory cell region of DRAM 100. FIG. 25 is a schematic plan view illustrating the layout of the isolation regions, element-forming regions and buried wiring of DRAM 100. Note however that capacitors located on capacitor contact pads and upper metal wiring located on the capacitors are omitted in FIG. 1, in order to clarify the layout of components. In addition, in FIG. 25, the edge portions of the semiconductor device of the present exemplary embodiment are illustrated but the intermediate parts of the semiconductor device are omitted. FIG. 2 is a group of cross-sectional views illustrating the configuration of DRAM 100 of the present exemplary embodiment, wherein FIG. 2A is the A-A' cross section of FIG. 1, whereas FIG. 2B is the B-B' cross section of FIG. 1. Note here that FIG. 2A is a cross-sectional view in the Y direction, whereas FIG. 2B is a cross-sectional view in the X direction, which is deviated therefrom in a strict sense. Nonetheless, FIG. 2B is described here as a cross-sectional view in the X direction. In DRAM 100 of the present exemplary embodiment, a silicon substrate is used for a semiconductor substrate serving as the base of DRAM 100. In addition, not only a unit semiconductor substrate but also a semiconductor substrate in the process of a semiconductor device being fabricated thereon and a semiconductor substrate on which a semiconductor device has been fabricated are generically referred to as a wafer.

As illustrated in FIGS. 1 and 25, DRAM 100 includes memory cell region 60, and peripheral region 61 in which driving transistors (not illustrated) are disposed outside memory cell region 60. Peripheral region 61 is composed of Y peripheral region 62 extending in the Y direction, X peripheral region 63 extending in the X direction (third direction), and second isolation region (STI) 59 provided outside these regions. That is, memory cell region 60 is formed so as to be surrounded by peripheral active region which includes Y peripheral region 62 and X peripheral region 63.

Memory cell region 60 is provided with first isolation region 9 (hereinafter referred to as "STI" (Shallow Trench Isolation) 9 in some cases) formed by burying an insulating film in isolation trenches 4 provided in silicon substrate 1, and element-forming regions 1A (hereinafter referred to as "active regions 1A" in some cases) divided off by STIs 9.

As illustrated in FIG. 25, a plurality of active regions 1A are provided in memory cell region 60. Each active region 1A extends in the X' direction (second direction) intersecting with the Y direction, and is located so as to be parallel to each other. Isolation trench 4 that defines the planar shape of each STI 9 includes a plurality of linear trench portions 65 extending in the X' direction intersecting with the Y direction, and crank-shaped trench portions 66 sandwiched between the plurality of active regions 1A located on the Y-direction edge side of memory cell region 60 and X peripheral region 63.

X peripheral region 63 adjacent to crank-shaped trench portion 66 has also crank-shaped. Part of a side surface of X peripheral region 63 abuts on an insulating film buried in crank-shaped trench portion 66 composing part of STI 9 and second isolation region (STI) 59 provided outside X peripheral region 63. Consequently, X peripheral region 63 is defined so as to be divided off by STIs 9 and 59. As will be described later, X peripheral region 63 is provided so as to protrude convexly from the upper surfaces of STIs 9 and 59. That is, X peripheral region 63 protrudes from the upper surfaces of STIs 9 and 59 in the normal-line direction of these upper surfaces toward buried word lines 23 (5). X peripheral region 63 is formed as the result of a plurality of unit patterns 64 being combined with each other in the X direction (third direction). Each unit pattern 64 is formed into a parallelogram by making width Y1 of one edge portion of the unit pattern equal to width Y2 of the other edge portion. In addition, each unit pattern 64 is arranged so that the short sides thereof are parallel to the Y direction. As described above, the Y-direction widths of each unit pattern 64 and X peripheral region 63 composed of a plurality of unit patterns 64 are made constant. Note that Y-direction width Y7 of each unit pattern 64 at boundary portion 56 thereof is larger than Y1 and Y2. However, since buried wiring 5 (22 and 23) substantially does not extend over this boundary portion 56, in the present exemplary embodiment, no adverse effects are exerted on the advantageous effects of the present invention. Accordingly, in the present invention, the Y-direction width of X peripheral region 63 is assumed to be constant, without regard to width Y7 at boundary portion 56, even if X peripheral region 63 has crank-shaped.

Each unit pattern 64 extends in the X' direction (direction parallel to the long side of the unit pattern), and is arranged so as to be parallel to each active region 1A. As described above, each unit pattern 64 extends in the X direction as with each active region 1A, and is arranged so that each unit pattern 64 and each active region 1A are parallel to each other. In addition, the shortest distance between each unit pattern 64 and each active region 1A in the Y direction (Y-direction width between each unit pattern 64 and active region 1A located in the farthermost position in the Y direction) is constant. That is, the shortest distance between active region 1A and X peripheral region 63 in Y direction is constant.

As illustrated in FIG. 25, the planar shape of each active region 1A is divided off and defined by the planar shape of each STI 9 (cell isolation region) formed by filling crank-shaped trench portions 66 and linear trench portions 65. As will be described later, each active region 1A is provided so as to convexly protrude from the upper surface of each STI 9. That is, each active region 1A protrudes from the upper surfaces of STI 9 in the normal-line direction of these upper surfaces toward buried word lines 23 (5). Here, in order to keep the Y-direction width of crank-shaped trench portions 66 constant, unit patterns 64 have to be disposed in accordance with the arrangement of active regions 1A. Since the plurality of active regions 1A are disposed on the Y-direction edge side of memory cell region 60, the length X of each unit pattern 64 is not uniform, thus resulting in the relationship X1>X2 in FIG. 25.

As illustrated in FIG. 25, a plurality of buried wirings 5 extending in the Y direction are provided on each active region 1A and X peripheral region 63 59, so as to cut across active region 1A and X peripheral region 63. By way of more detailed description, the plurality of buried wirings (first wirings) 5 are composed of buried word lines 23 extending in the Y direction (first direction) and buried wiring 22 for isolation, as illustrated in FIG. 1. Buried word lines 23 and buried wiring 22 for isolation have the same structure but differ in functionality. Each buried word line 23 functions as the gate electrode of a memory cell. Buried wiring 22 for isolation functions to isolate elements (transistors) adjacent to the wiring by being maintained at a predetermined potential. That is, elements adjacent to each other on the same active region 1A can be isolated from each other by maintaining buried wiring 22 for isolation at a predetermined potential, and thereby placing parasitic transistors in an off-state. As illustrated in FIG. 25, a plan-view area of a region in which the buried wiring 5 and X peripheral region 63 intersect with each other is larger than an area of a region in which the buried wiring 5 and each of the plurality of active regions 1A intersect with each other.

As illustrated in FIG. 2A, buried wiring 22 covers the upper surfaces of a plurality of STIs 9 and part of silicon substrate 1. A cross-sectional area variation in these upper surfaces may lead to the variation of wiring resistance. Consequently, the area variation can be a cause for disturbance in the functionality of buried wiring 22. This is also true for buried word lines 23. The cross-sectional area variation of buried wiring 5 depends on the height variation of silicon protruding part 1B sandwiched by STIs 9. In the present exemplary embodiment, however, the widths of silicon protruding parts 1B in memory cell region 60 are made uniform, as will be discussed in detail later in the description of a manufacturing method. Thus, the height variation of silicon protruding parts 1B does not occur. This height variation has to be suppressed not only in memory cell region 60 but also in peripheral region 61. As described above, however, the width of unit patterns 64 composing X peripheral region 63 with which buried wiring 5 intersects is kept constant, and therefore, the height variation of X peripheral region 63 does not occur, as with memory cell region 60. As a result, the variation of wiring resistance can be reduced by keeping constant the film thickness of buried wiring 5 on X peripheral region 63.

A plurality of bit lines 30 are disposed at predetermined intervals in a direction perpendicular to buried wiring 5 (X direction in FIG. 1). Each memory cell is formed in a region where each buried word line 23 and each active region 1A intersects with each other. A plurality of memory cells are provided in the entire range of memory cell region 60, and a capacitor is provided through capacitor contact pad 42 in each memory cell. As illustrated in FIG. 1, each capacitor contact pad 42 is formed so that at least a part thereof is positioned on capacitor contact plug 41. In addition, capacitor contact pads 42 are disposed at predetermined intervals within memory cell region 60, so as not to overlap with one another. As illustrated in FIG. 1, DRAM 100 of the present exemplary embodiment is configured to have a 6F2 cell layout (F value is the minimum feature size) corresponding to a unit area in which an X-direction interval and a Y-direction interval are defined as 3F and 2F, respectively.

DRAM 100 of the present exemplary embodiment is provided with an buried-gate transistor in which buried word line 23 functioning as a gate electrode is completely buried in silicon substrate 1, as illustrated in FIG. 2B. As illustrated in FIG. 2, the buried-gate transistor is provided in active region 1A surrounded by STIs 9 serving as first isolation regions of silicon substrate 1. Each STI 9 is formed by laminating insulating films 6 and 7 in a trench of silicon substrate 1. The buried-gate transistor includes gate insulating film 16 covering the inner walls of a trench provided in active region 1A, interposer layer 17 covering the upper surface and part of the side surfaces of gate insulating film 16, conductive film 18 provided inside interposer layer 17 to serve as buried word line 23, impurity-diffused layer 26 provided in low-concentration impurity-diffused layer 11 to serve as one of source/drain regions, and impurity-diffused layer 37 to serve as the other one of the source/drain regions.

Each low-concentration impurity-diffused layer 11 is provided in the upper portion of each active region 1A, except an area thereof in which gate insulating film 16 is provided. Impurity-diffused layer 11 is a layer diffused with an impurity opposite in conductivity type to a conductive impurity contained in abundance in silicon substrate 1. The upper surface of conductive film 18 is covered with liner film 20 and buried insulating film 21. Although only two buried-gate transistors including buried word lines 23 are shown in active region 1A illustrated in FIG. 2B for convenience of description, several thousand to several hundred thousand buried-gate transistors are disposed in a memory cell region of an actual DRAM. Conductive film 18A illustrated in FIG. 2B does not function as a word line, however, though the conductive film is the same in structure as buried word line 23. Instead, conductive film 18A serves as buried wiring 22 for electrically isolating adjacent buried-gate transistors.

As illustrated in FIG. 2A, each buried-gate transistor of the present exemplary embodiment has a structure in which part of buried wiring 22 is buried in the upper surfaces of STIs 9 disposed in the extending direction of buried wiring 22. That is, STIs 9 are disposed so that the upper-surface height of adjacent STIs 9 is less than the surface height of silicon substrate 1 between the STIs. Consequently, on the upper surface of silicon substrate 1, there is provided portions of STIs 9 filled with buried wiring 22 and saddle-shaped silicon protruding parts 1B to which the bottom surface of buried wiring 22 connects through gate insulating film 16. Since each buried word line 23 has the same structure as that of buried wiring 22, the same portions of STIs 9 filled with buried wiring 22 and saddle-shaped silicon protruding parts 1B are also provided below buried word lines 23.

Saddle-shaped silicon protruding parts 1B can be made to function as channels when the potential difference of the silicon protruding parts from source and drain regions exceeds a given threshold. Buried-gate transistors of the present exemplary embodiment are saddle-fin transistors including such channel regions as saddle-shaped silicon protruding parts 1B. Applying a saddle-fin transistor as a buried-gate transistor has the advantage of increasing an on-state current.

Next, a configuration of the semiconductor device on and above each of the above-described buried-gate transistors will be described while referring to FIG. 2. The memory cell region of DRAM 100 is provided with a plurality of memory cells including the above-described buried-gate transistors and capacitors 48. Each capacitor 48 is a cylindrical capacitor and is composed of lower electrode 45, capacitor insulating film 46 and upper electrode 47. Lower electrode 45 is cylindrical and includes an inner wall and an outer wall. The inner wall side is filled with capacitor insulating film 46 and upper electrode 47. Impurity-diffused layer 26 of each buried-gate transistor is connected to conductive film 27 provided on impurity-diffused layer 26. Here, conductive film 27 composes bit line 30 along with conductive film 28 provided on conductive film 27. The upper surface of bit line 30 is covered with mask film 29, and the side surfaces of the bit line 30 are covered with insulating film 31. Impurity-diffused layer 37 of each buried-gate transistor is connected to lower electrode 45 through capacitor contact plug 41 and capacitor contact pad 42 provided on impurity-diffused layer 37. Here, capacitor contact plug 41 has a laminated structure in which interposer layer 39 is interposed between conductive film 38 and conductive film 40. The side surfaces of capacitor contact plug 41 are covered with sidewall insulating film 36. In addition, capacitor contact pad 42 is provided in order to secure the alignment margin between capacitor 48 and capacitor contact plug 41. Accordingly, capacitor contact pad 42 need not cover the upper surface of capacitor contact plug 41, but has only to be positioned on capacitor contact plug 41 and connected to at least a part thereof.

The side surfaces of bit lines 30, mask films 29 and capacitor contact plugs 41 are covered with first interlayer insulating film 24, insulating film 31, liner film 32 and coated insulating film 33 (hereinafter described as SOD [Spin On Dielectrics] 33). In addition, each capacitor contact pad 42 is covered with stopper film 43 for protecting SOD 33. Third interlayer insulating film 44 is provided on stopper film 43. Since cylinder hole 44A penetrating through third interlayer insulating film 44 and stopper film 43 is covered with lower electrode 45, the outer wall of lower electrode 45 have contact with third interlayer insulating film 44 and stopper film 43. The upper surface of third interlayer insulating film 44 is covered with capacitor insulating film 46, and the upper surface of capacitor insulating film 46 is covered with upper electrode 47.

Upper electrode 47 is covered with fourth interlayer insulating film 49. Contact plug 50 is provided within fourth interlayer insulating film 49, and upper metal wiring 51 is provided on the upper surface of fourth interlayer insulating film 49. Upper electrode 47 of capacitor 48 is connected to upper metal wiring 51 through contact plug 50. Upper metal wiring 51 and fourth interlayer insulating film 49 are covered with protective film 52.

Although as a capacitor of the present exemplary embodiment, a description is given of a cylindrical capacitor which utilizes only the inner wall of lower electrode 45 as an electrode, the capacitor is not limited to this cylindrical capacitor. For example, the capacitor can be changed to a crown-shaped capacitor which utilizes the inner and outer walls of lower electrode 45 as electrodes. A wiring layer composed of upper metal wiring 51 and protective film 52 is provided on the capacitor through fourth interlayer insulating film 49. Although in the present exemplary embodiment, a single-layer wiring structure composed of a single wiring layer is described by way of example, the wiring layer is not limited to this wiring structure. For example, the single-layer wiring structure can be changed to a multilayer wiring structure composed of a plurality of wirings and a plurality of interlayer insulating films.

As described above, each buried-gate transistor of the present exemplary embodiment includes with a peripheral region (X peripheral region 63) with the width being kept constant in the extending direction of buried wiring 5. Accordingly, it is possible to reduce the film thickness variation of a plurality of buried wirings (first wirings) 5 on X peripheral region 63. As a result, each buried-gate transistor of the present exemplary embodiment has a configuration more effective than the configuration of a buried-gate transistor according to the related art in reducing the wiring resistance variation of buried wiring 5.

Next, a method for manufacturing a semiconductor device of the present exemplary embodiment will be described by citing a case in which the semiconductor device is DRAM 100, while referring to FIGS. 3 to 25. In each diagram, a view denoted by "A" is a cross-sectional view corresponding to the A-A' cross section of FIG. 1, whereas a view denoted by "B" is a cross-sectional view corresponding to the B-B' cross section of FIG. 1. In addition, as in the case of FIG. 2, views denoted by "A" are described as cross-sectional views parallel to the Y direction. Likewise, views denoted by "B" are cross-sectional views parallel to the X direction.

Figure 3:
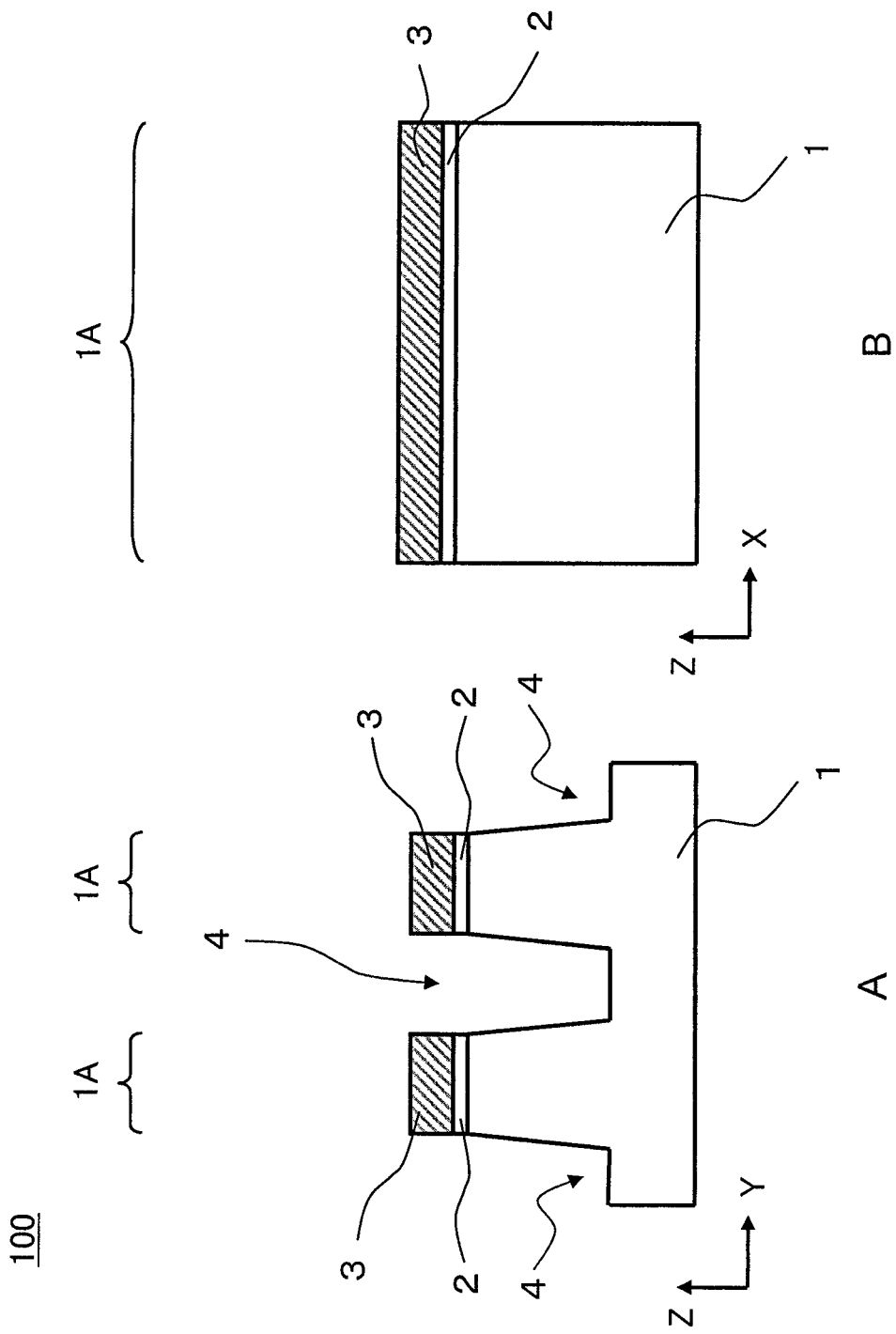
FIGS. 3A and 3B are cross-sectional views illustrating one step of a method for manufacturing the semiconductor device illustrated in FIGS. 1 and 2.

As illustrated in FIG. 3, sacrificial film 2 which is a silicon oxide film ($SiO_2$) and mask film 3 which is a silicon nitride film ($Si_3N_4$) are deposited in order on P-type silicon substrate 1 by a thermal oxidation method and by a thermal CVD (Chemical Vapor Deposition) method, respectively. Next, mask film 3, sacrificial film 2, and silicon substrate 1 are patterned using photolithographic and dry etching techniques to form isolation trench 4 for dividing off active region 1A, X peripheral region 63 (not illustrated) and Y peripheral region 62 (not illustrated) in silicon substrate 1. By way of more detailed description, each isolation trench 4 is formed as an outer circumference of peripheral region 61, along with a plurality of linear trench portions 65 extending in the X direction and each crank-shaped trench portion 66 sandwiched by STI 9 and X peripheral region 63, as illustrated in FIG. 25. Upper portions of silicon substrate 1 serving as active regions 1A are covered with mask film 3.

Figure 4:
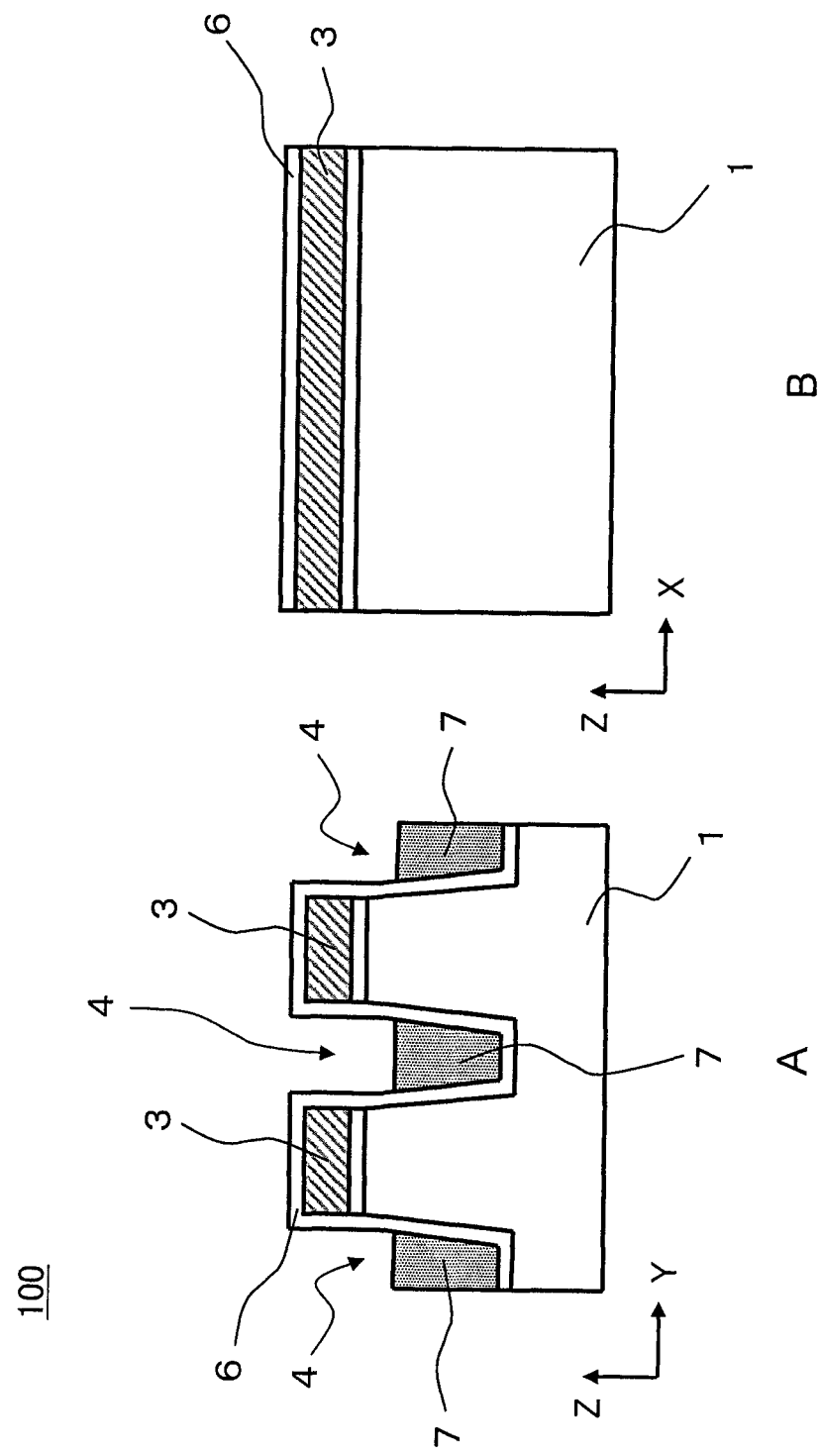
FIGS. 4A and 4B are cross-sectional views illustrating one step of the method for manufacturing the semiconductor device illustrated in FIGS. 1 and 2.

As illustrated in FIG. 4, insulating film 6 which is a silicon oxide film is formed on surfaces of silicon substrate 1 and mask film 3 by a thermal oxidation method. Thereafter, insulating film 7 which is a silicon nitride film is deposited by a thermal CVD method, so as to fill isolation trenches 4, and then etched back to leave over insulating film 7 only within isolation trenches 4.

Figure 5:
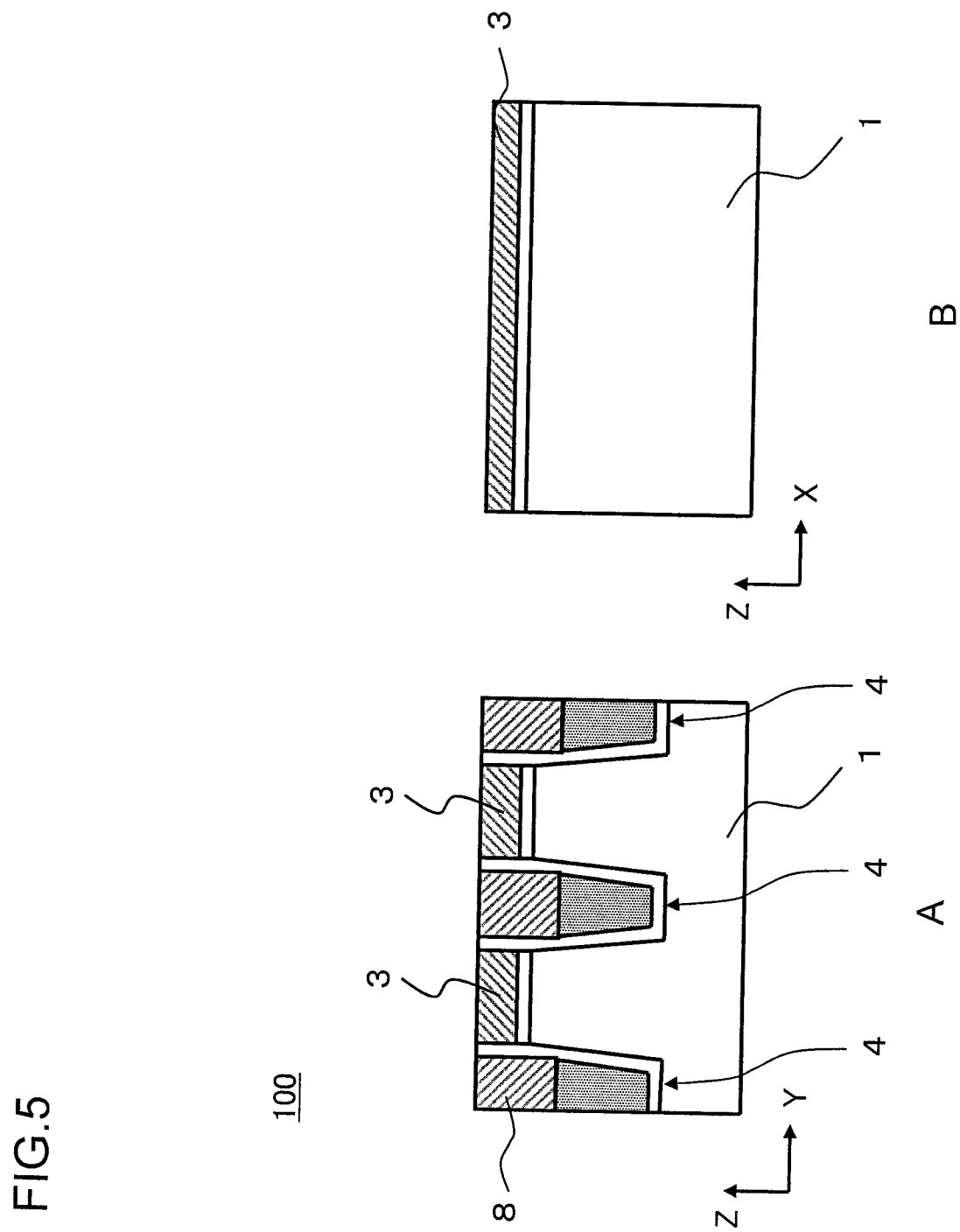
FIGS. 5A and 5B are cross-sectional views illustrating one step of the method for manufacturing the semiconductor device illustrated in FIGS. 1 and 2.

As illustrated in FIG. 5, buried film 8 which is a silicon oxide film is deposited by a plasma CVD method, so as to fill isolation trenches 4. Then, a CMP (Chemical Mechanical Polishing) treatment is performed until mask film 3 formed in FIG. 3 becomes exposed, thereby planarizing the surface of buried film 8.

Figure 6:
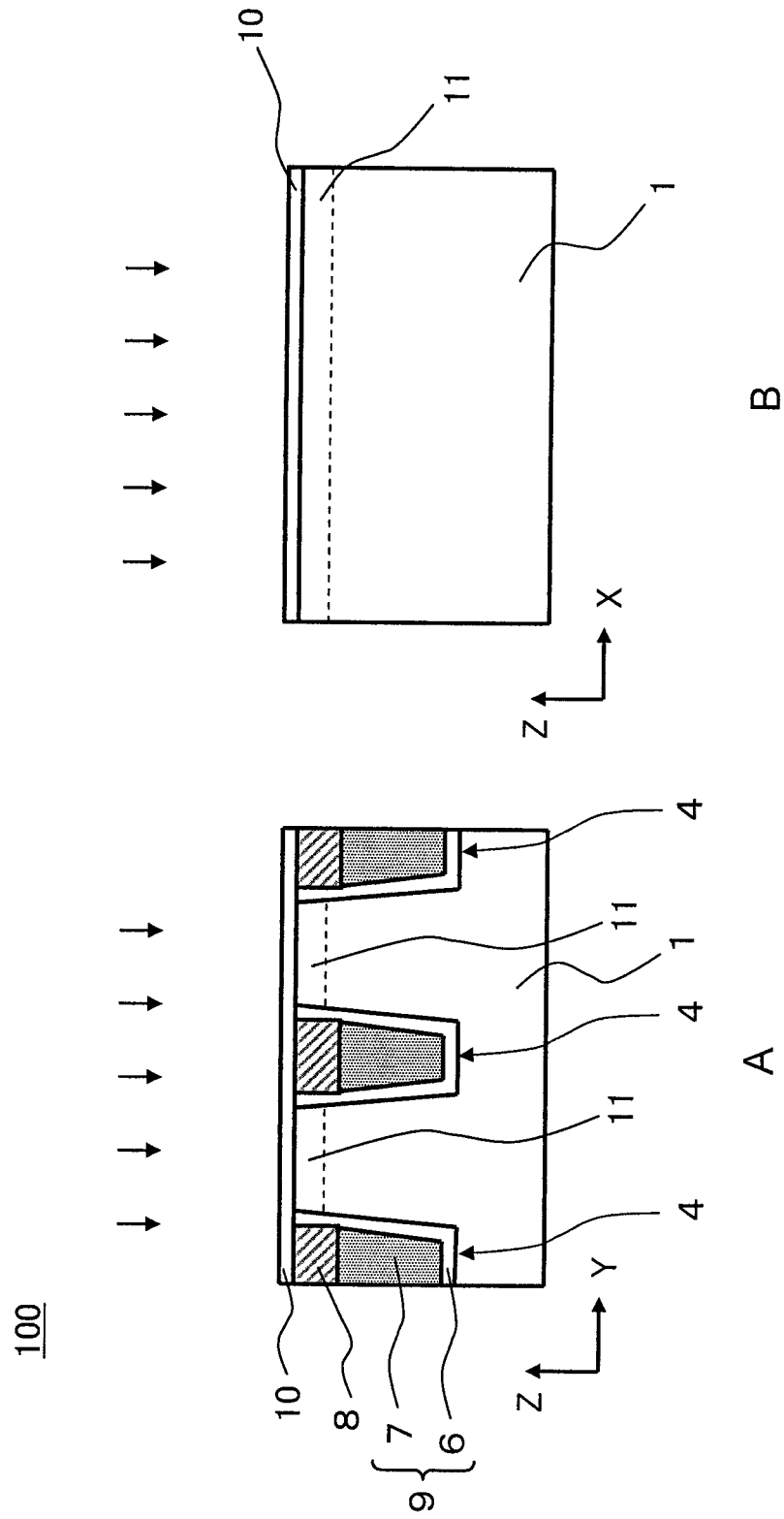
FIGS. 6A and 6B are cross-sectional views illustrating one step of the method for manufacturing the semiconductor device illustrated in FIGS. 1 and 2.

As illustrated in FIG. 6, mask film 3 and sacrificial film 2 are removed by wet etching to expose parts of silicon substrate 1. In addition, surface of buried film 8 of each isolation trench 4 is made substantially level with exposed surfaces of silicon substrate 1. As the result of processing described above, there are formed STIs (first isolation regions) 9 and STIs 59 S(second isolation regions which are not illustrated) composed of silicon oxide film 6 and silicon nitride film 7. In the method for manufacturing DRAM 100 according to the present exemplary embodiment, line-shaped active regions 1A, X peripheral region 63 and Y peripheral region 62 in memory cell region 60 are divided off and formed, as illustrated in FIG. 25, as the result of STIs 9 and 59 being formed. By way of more detailed description, Y peripheral region 62 extending in the Y direction and thus formed into a linear shape and X peripheral region 63 extending in the X direction and thus formed into a cranked shape are formed in peripheral region 61. In addition, X peripheral region 63 is composed of unit patterns 64 formed into parallelograms.

After the formation of STIs 9 and 59, sacrificial film 10 which is a silicon oxide film is formed in the surface of silicon substrate 1 by a thermal oxidation method. Thereafter, a low-concentration N-type impurity (phosphorous or the like) is implanted into silicon substrate 1 by an ion implantation method to form low-concentration N-type impurity-diffused layer 11. Low-concentration impurity-diffused layer 11 functions as part of source/drain (S/D) regions of a transistor.

Figure 7:
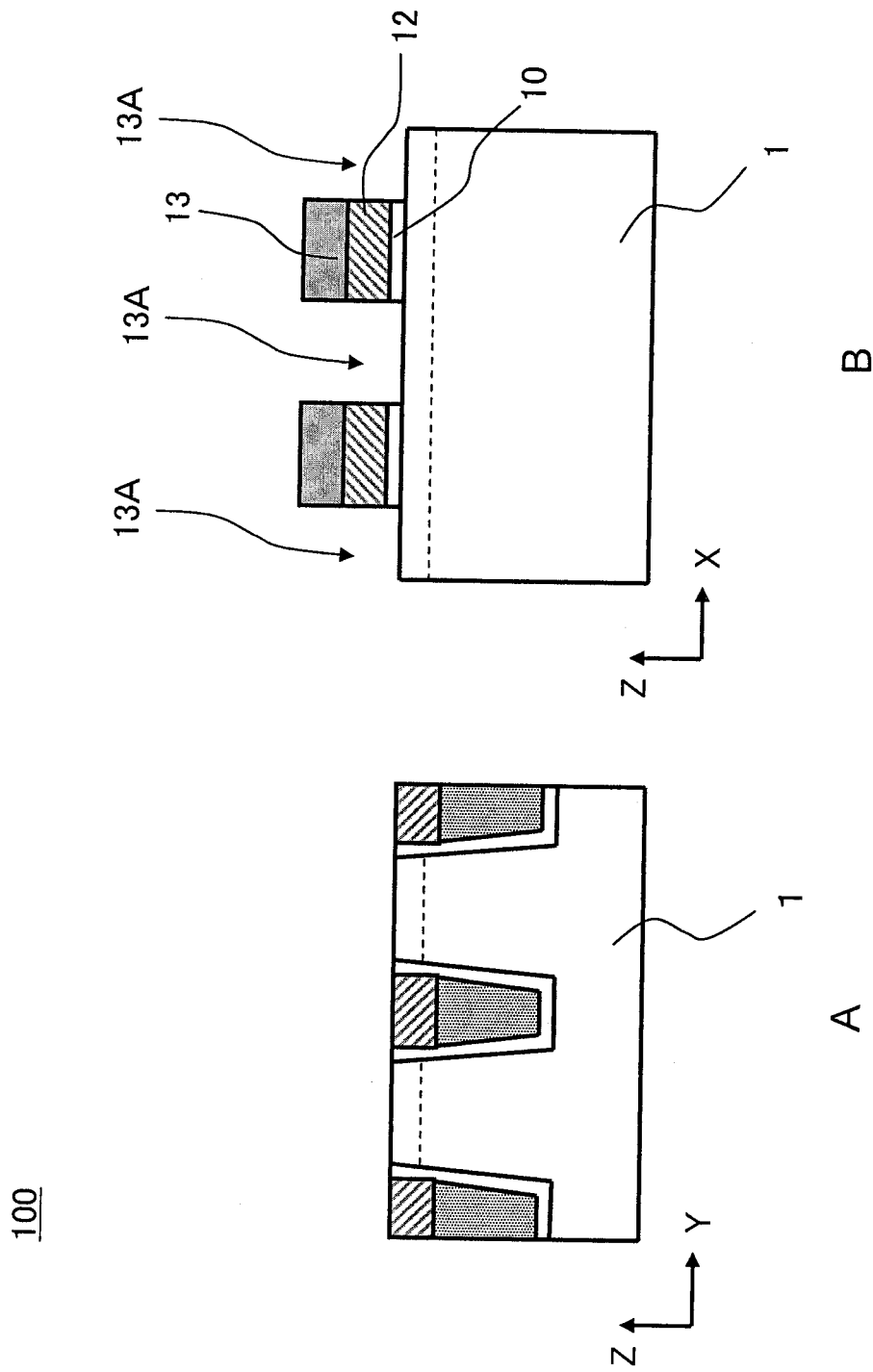
FIGS. 7A and 7B are cross-sectional views illustrating one step of the method for manufacturing the semiconductor device illustrated in FIGS. 1 and 2.
Figure 8:
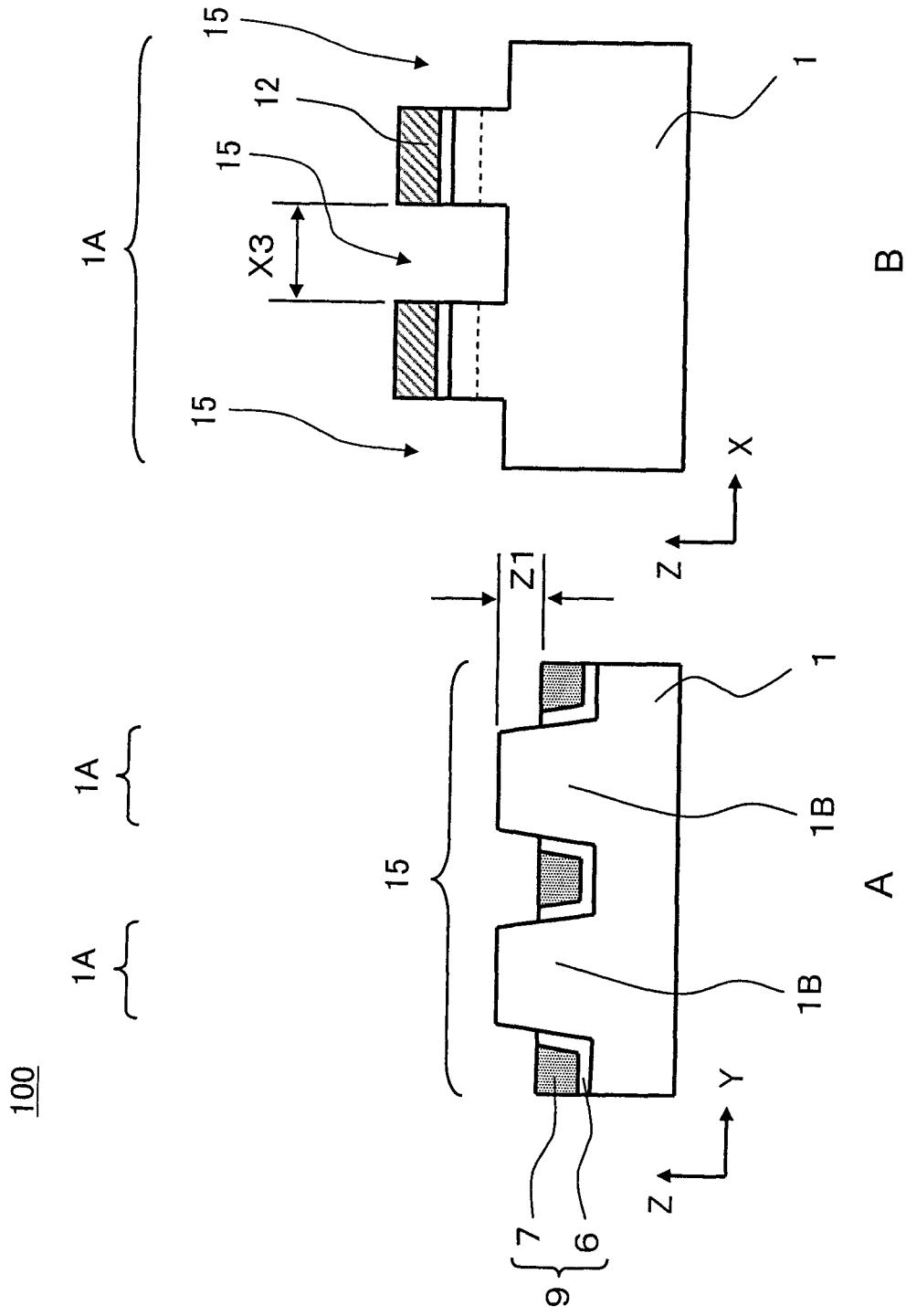
FIGS. 8A and 8B are cross-sectional views illustrating one step of the method for manufacturing the semiconductor device illustrated in FIGS. 1 and 2.

As illustrated in FIG. 7, lower-layer mask film 12 which is a silicon nitride film is formed on sacrificial film 10 by a CVD method. In addition, upper-layer mask film 13 which is a carbon film (amorphous carbon film) is deposited on lower-layer mask film 12 by a plasma CVD method. Thereafter, openings 13A are formed in upper-layer mask film 13 and lower-layer mask film 12 to expose parts of silicon substrate 1. These openings 13A are extended in the Y direction so as to locate in the same position as buried wiring 5 (see FIG. 25). Accordingly, the exposed parts of silicon substrate 1 are present not only in active regions 1A but also in X peripheral region 63 (see FIG. 25). As illustrated in FIG. 8, the parts of silicon substrate 1 exposed out of openings 13A are etched by dry etching using lower-layer mask film 12 and upper-layer mask film 13, thereby forming gate electrode trenches 15 of 35 nm in width X3. This dry etching is performed by a reactive ion etching (RIE) method based on inductively-coupled plasma (ICP), using tetrafluoromethane ($CF_4$), sulfur hexafluoride ($SF_6$), chlorine ($Cl_2$) and helium (He) as process gases at a bias power of 100 to 300 W and a pressure of 3 to 10 Pa. Gate electrode trenches 15 are formed as line-shaped patterns extending in the Y direction intersecting with active regions 1A and X peripheral region 63. Upper-layer mask film 13 is also removed at the time of this dry etching. When forming gate electrode trenches 15, STIs 9 and 59 are etched deeper than the surfaces of silicon protruding parts 1B. This etching causes saddle-shaped silicon protruding parts 1B of 55 nm in height Z1 from the upper surfaces of STIs 9 and 59, to be left over. This is also true for active regions composing X peripheral region 63. Each of these saddle-shaped silicon protruding parts 1B functions as a channel region of a transistor.

Here, a method for forming gate electrode trenches 15 according to the related art will be described in detail using FIGS. 27 and 28, in order to clarify the advantageous effects of the present exemplary embodiment. For ease of understanding the characteristic features of the formation method, two places (place near width Y5 and place near width Y6) of X peripheral region 63A illustrated in FIG. 26 are shown side by side in the cross-sectional views of FIGS. 27 and 28.

In the related art, each STI 9 is first dug down by dry etching, as illustrated in FIG. 27, to form holes 15A on STIs 9 and 59. At this time, respective holes 15A are separated by silicon protruding part 10 the Y-direction width of which is Y5 and silicon protruding part 1D the Y-direction width of which is Y6, and are therefore discontinuous. In addition, since silicon protruding parts 10 and 1D remain without being etched away, side surfaces of the silicon protruding parts in contact with STIs 9 and 59 become exposed. The related art and the present exemplary embodiment are common to each other in the formation method up to this condition.

Next, as illustrated in FIG. 28, upper portions of silicon protruding parts 10 and 1D are removed by dry etching, in order to continuously connect holes 15A to form gate electrode trenches 15. In this dry etching, the selection ratio between STIs 9 and 59 is improved by increasing the flow rate of sulfur hexafluoride ($SF_6$), thus allowing only silicon protruding parts 10 and 1D to be removed. Sulfur hexafluoride ($SF_6$) reaches not only to the upper surfaces of silicon protruding parts 1C and 1D but also to the side surfaces thereof. Therefore, etching from the side surfaces (referred to as side etching) also takes place in silicon protruding parts 10 and 1D. Accordingly, in silicon protruding part 1C small in width, side etching reaches to the central part thereof, thus accelerating etching from the upper surface thereof. As a result, silicon protruding part 10 is smaller in height than silicon protruding part 1D having a large width in which side etching does not reach to the central part thereof (Z2<Z3). As described above, the widths of silicon protruding parts forming gate electrode trenches 15 differ in the related art. Consequently, the amount of side etching at the time of forming the gate electrode trenches varies, thus causing height variation Z4 of approximately 50 nm in the silicon protruding parts.

On the other hand, in the present exemplary embodiment, the Y-direction width of unit patterns 64 composing X peripheral region 63 (see FIG. 25) is kept constant (Y1=Y2), thereby keeping the width of silicon protruding parts in X peripheral region 63 constant. Consequently, the amount of side etching of the silicon protruding parts is made uniform. As a result, the height of the silicon protruding parts of gate electrode trenches 15 can be made stable and uniform without causing any variations.

Figure 9:
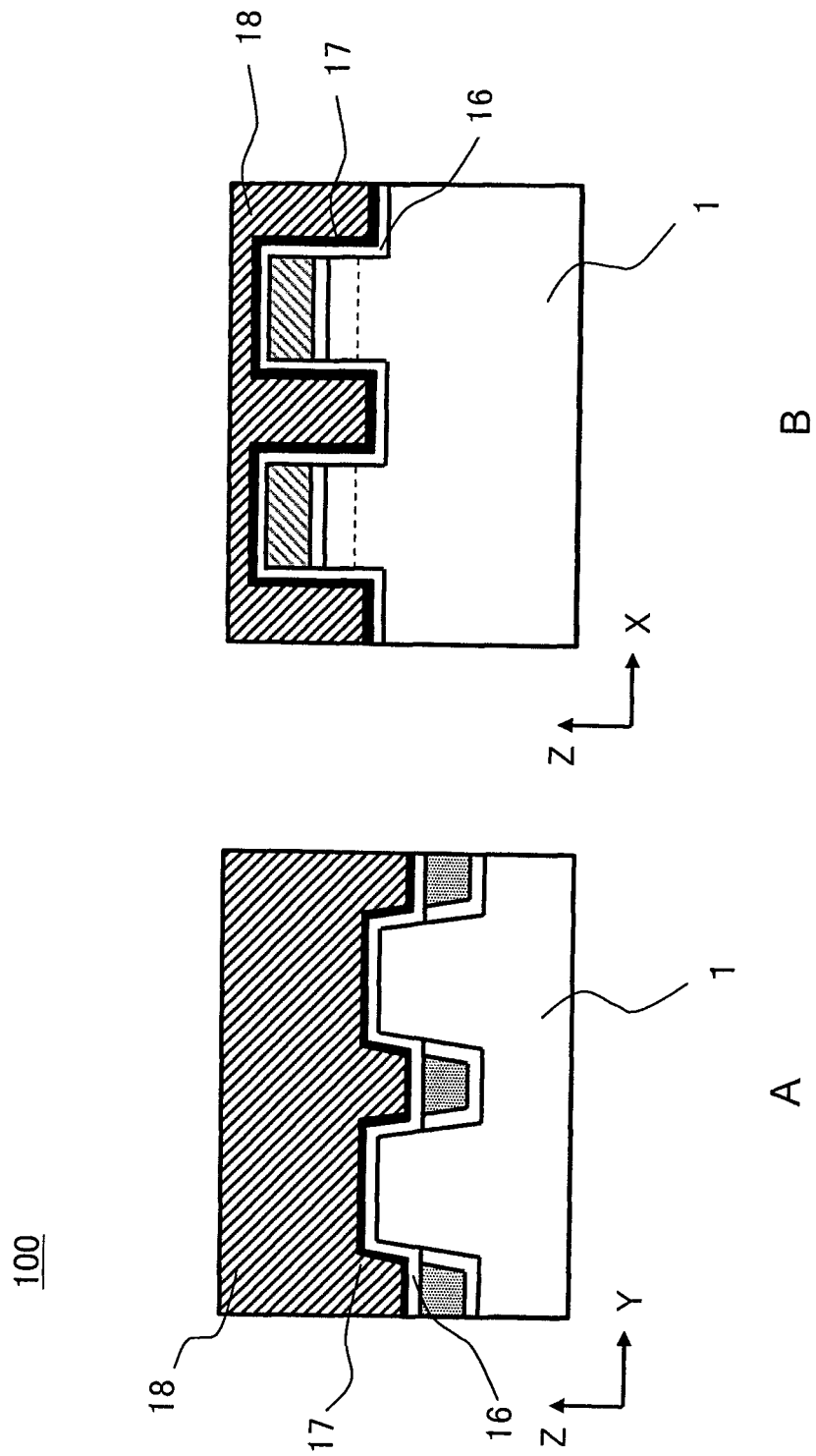
FIGS. 9A and 9B are cross-sectional views illustrating one step of the method for manufacturing the semiconductor device illustrated in FIGS. 1 and 2.

As illustrated in FIG. 9, gate insulating film 16 is formed. As gate insulating film 16, it is possible to use a silicon oxide film or the like formed by a thermal oxidation method. Thereafter, interposer layer 17 which is a titanium nitride (TiN) layer and conductive film 18 which is a tungsten (W) film are deposited in order by a CVD method.

Figure 10:
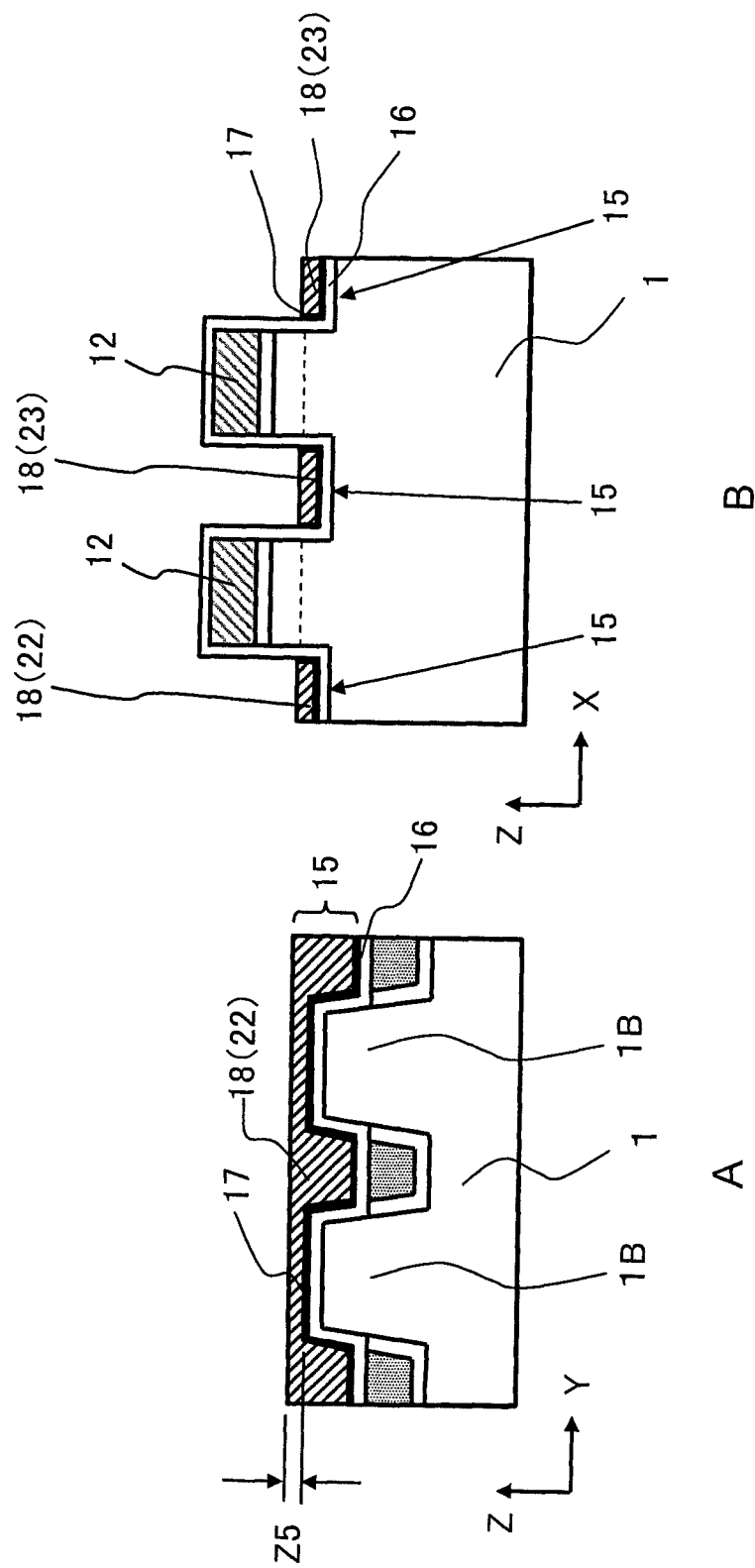
FIGS. 10A and 10B are cross-sectional views illustrating one step of the method for manufacturing the semiconductor device illustrated in FIGS. 1 and 2.

As illustrated in FIG. 10, an unnecessary upper portion of conductive film 18 is removed by dry etching in gate electrode trenches 15, so that a portion of conductive film 18 of approximately 145 nm in thickness Z5 from the upper surfaces of silicon protruding parts 1B is left over. This dry etching is subject to the condition that no bias is applied to a wafer and that the selection ratio of conductive film 18 with respect to interposer layer 17 and gate insulating film 16 is 6 or higher. Accordingly, only conductive film 18 can be easily left over on the bottom of each gate electrode trench 15. FIG. 30A is a cross-sectional view illustrating active region 1A in memory cell region 60 after removing conductive film 18 partly. FIGS. 30B and 30C are cross-sectional views illustrating X peripheral regions 63 in peripheral region 61 after removing conductive film 18 partly. As illustrated in FIG. 30, it is possible to prevent from causing any thickness variations in conductive film 18 in the present exemplary embodiment. That is, the height of silicon protruding parts 1B is uniform, and therefore, the thickness of conductive film 18 on silicon protruding parts 1B is also uniform. Since the Y-direction width of unit patterns 64 composing the active regions of X peripheral region 63 is kept constant (Y1=Y2), the height of silicon protruding parts is uniform, as illustrated in FIG. 30. Consequently, no variations are caused either in the thickness of conductive film 18. The height of conductive film 18 to be left over can be controlled by a dry etching treatment time. Note that silicon protruding parts 1C have convex shape in which central parts 1CA of the silicon protruding parts 1C are higher than peripheral parts 1CB of the silicon protruding parts 1C when viewed from a bottom surface 1E of the semiconductor substrate 1, as illustrated in FIGS. 30B and 30C. The central parts (upper surfaces) 1CA of the silicon protruding parts 1C have a substantially uniform height. In addition, the central parts 1CA of the silicon protruding parts 1C are larger in height than an upper surface 1AA of the active region 1A when viewed from the bottom surface 1E of the semiconductor substrate 1, as illustrated in FIGS. 30.

On the other hand, the thickness of conductive film 18 according to the related art after the formation of the conductive film is 170 nm in thickness Z5 on silicon protruding part 1C of X peripheral region 63 and 120 nm in thickness Z6 on silicon protruding part 1D, as illustrated in FIG. 29. As a result, the thickness of conductive film 18 varies according to the height variation of silicon protruding parts.

An unnecessary portion of interposer layer 17 is removed by dry etching, so that the interposer layer 17 is left over at a height level with the surface of conductive film 18 on the bottom of each gate electrode trench 15. This dry etching is subject to the condition that no bias is applied to a wafer and that the selection ratio of interposer layer 17 with respect to lower-layer mask film 12 and gate insulating film 16 is 6 or higher. Accordingly, only interposer layer 17 can be easily left over on the bottom of each gate electrode trench 15. The height of interposer layer 17 to be left over can be controlled by a dry etching treatment time. By this dry etching, it is possible to form buried word lines 23 and buried wiring 22 composed of interposer layer 17 and conductive film 18 on the bottoms of gate electrode trenches 15.

Figure 11:
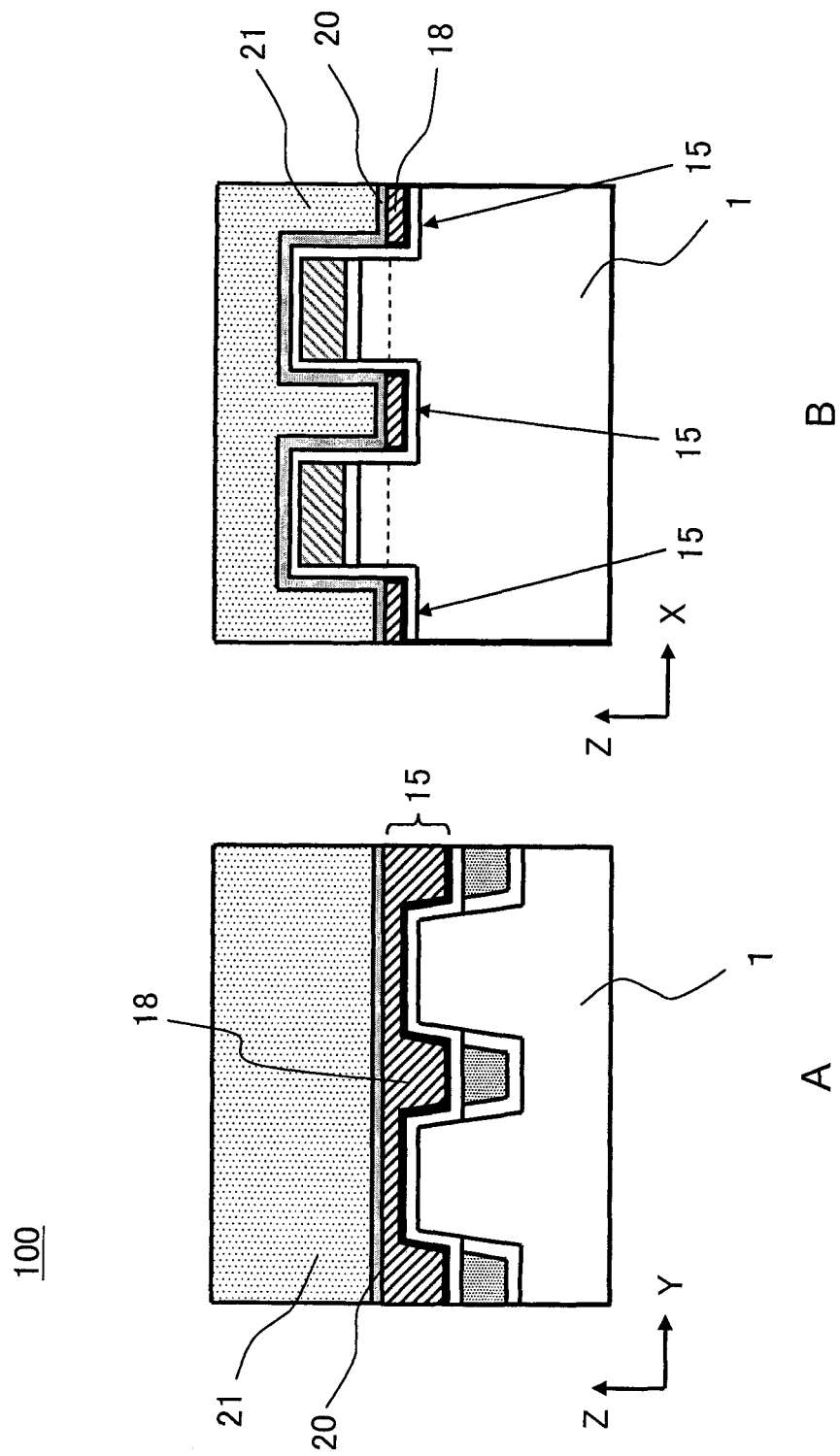
FIGS. 11A and 11B are cross-sectional views illustrating one step of the method for manufacturing the semiconductor device illustrated in FIGS. 1 and 2.

As illustrated in FIG. 11, liner film 20 which is a silicon nitride film is formed by a thermal CVD method, so as to cover the upper surface of left-over conductive film 18 and the inner wall of each gate electrode trench 15. Next, buried insulating film 21 is deposited on liner film 20. As buried insulating film 21, it is possible to use a silicon oxide film formed by a plasma CVD method, an SOD film which is a coated film, or a laminated film composed thereof. When an SOD film is used, the SOD film is annealing-treated in a high-temperature steam ($H_2O$) atmosphere after film formation and reformed into a solid-state film.

Figure 12:
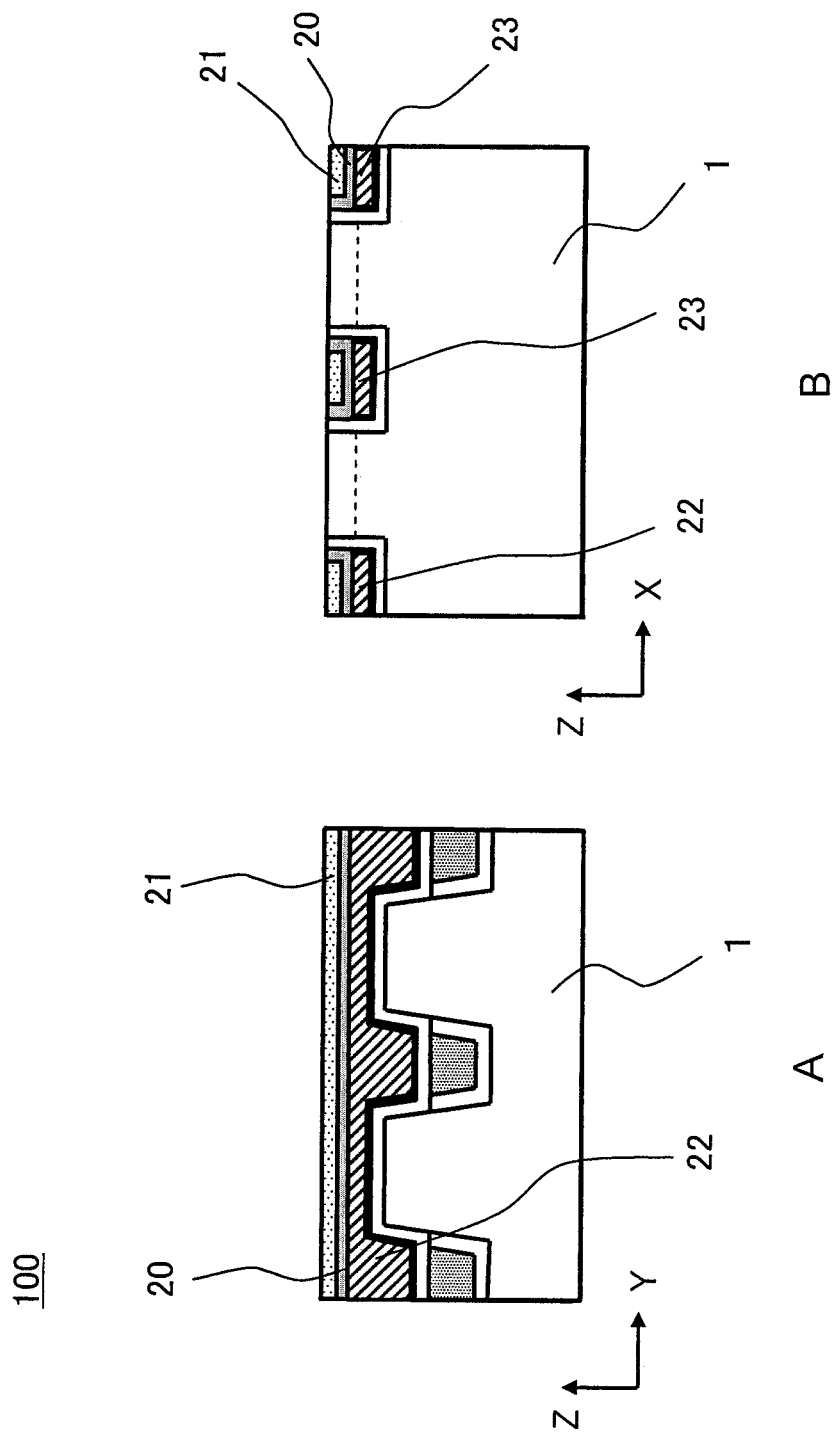
FIGS. 12A and 12B are cross-sectional views illustrating one step of the method for manufacturing the semiconductor device illustrated in FIGS. 1 and 2.

As illustrated in FIG. 12, buried insulating film 21 is removed by a CMP method until liner film 20 becomes exposed. Thereafter, lower-layer mask film 12, sacrificial film 10, and parts of buried insulating film 21 and liner film 20 are removed by etch-back, so that the surface of buried insulating film 21 is substantially level with the surface of silicon substrate 1. Consequently, the upper surfaces of each buried word line 23 and each buried wiring 22 for isolation are isolated from each other.

Figure 13:
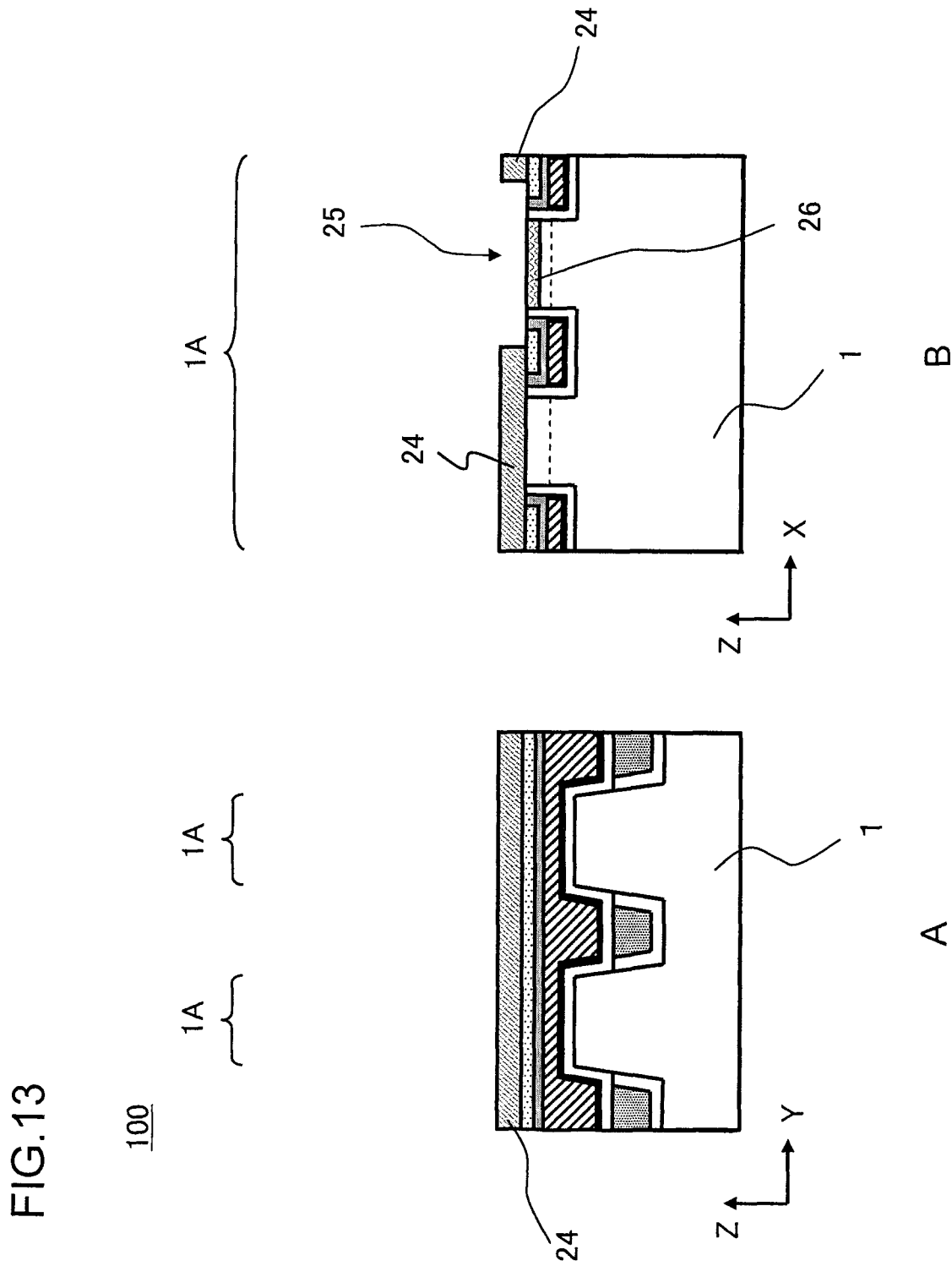
FIGS. 13A and 13B are cross-sectional views illustrating one step of the method for manufacturing the semiconductor device illustrated in FIGS. 1 and 2.

As illustrated in FIG. 13, first interlayer insulating film 24 which is a silicon oxide film formed by a plasma CVD method is formed so as to cover silicon substrate 1. Thereafter, part of first interlayer insulating film 24 is removed using photolithographic and dry etching techniques to form bit contact opening 25. As illustrated in FIG. 1, the surface of silicon substrate 1 is exposed in an area where bit contact opening 25 and active region 1A overlap with each other. After the formation of bit contact opening 25, an N-type impurity (arsenic or the like) is ion-implanted into the bottom of bit contact opening 25 to form N-type impurity-diffused layer 26 in the vicinity of the surface of silicon substrate 1. N-type impurity-diffused layer 26 thus formed functions as source/drain regions of a transistor.

Figure 14:
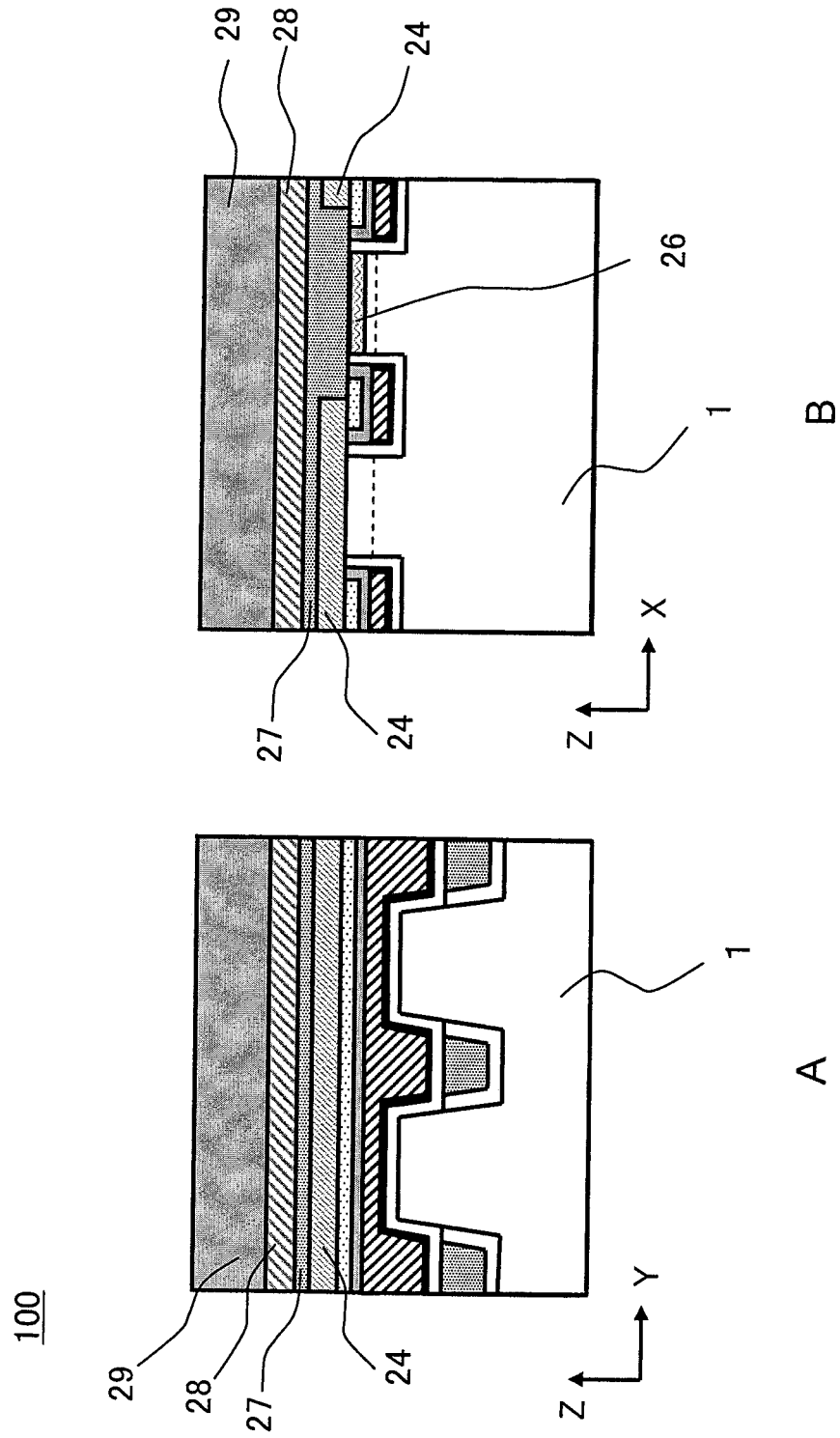
FIGS. 14A and 14B are cross-sectional views illustrating one step of the method for manufacturing the semiconductor device illustrated in FIGS. 1 and 2.

As illustrated in FIG. 14, there is formed conductive film 27 which is a polysilicon film formed by a thermal CVD method and containing an N-type impurity (phosphorous or the like), conductive film 28 which is a tungsten film formed by a sputtering method, and mask film 29 which is a silicon nitride film formed by a plasma CVD method in order, so as to cover impurity-diffused layer 26 and first interlayer insulating film 24.

Figure 15:
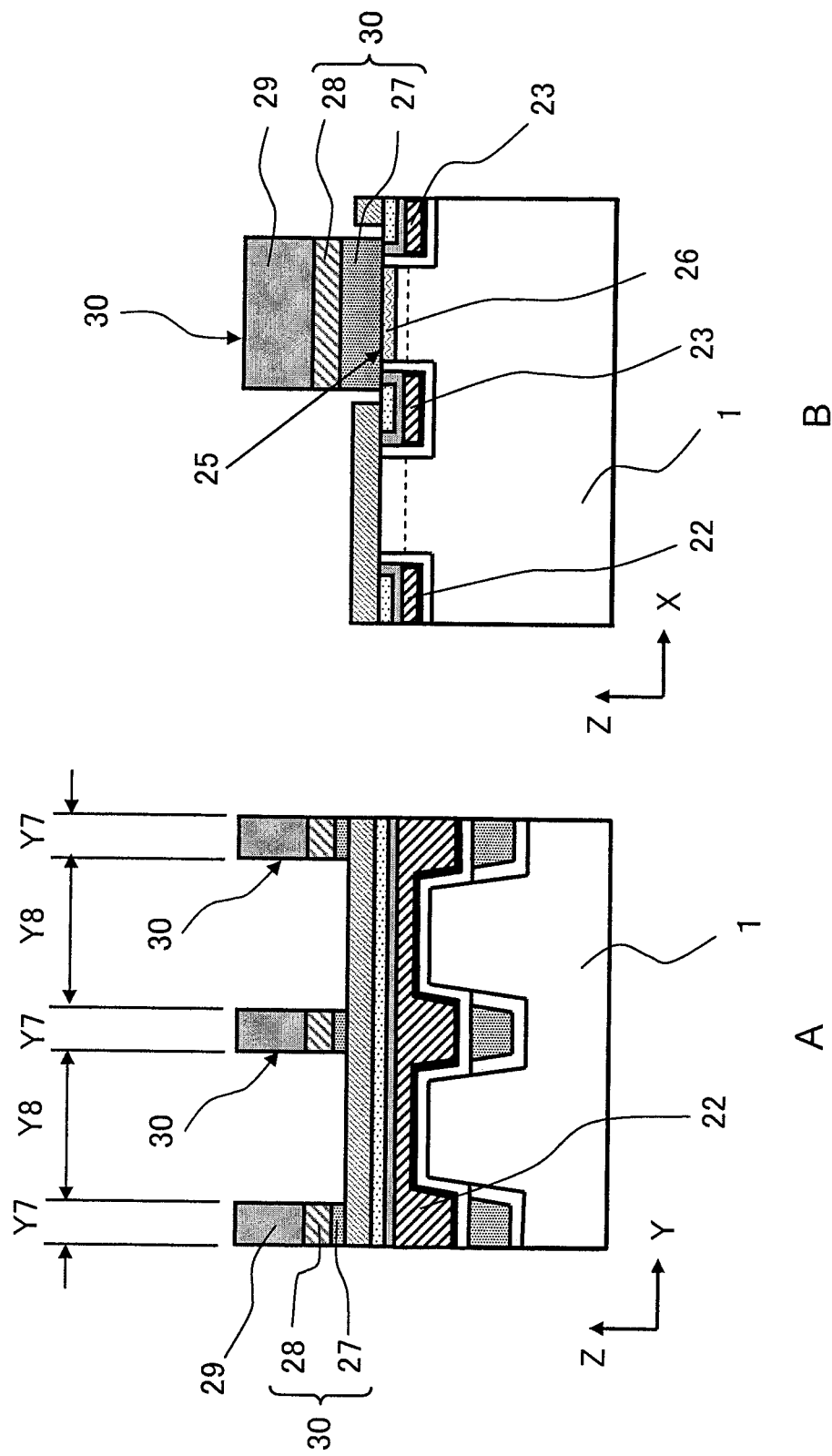
FIGS. 15A and 15B are cross-sectional views illustrating one step of the method for manufacturing the semiconductor device illustrated in FIGS. 1 and 2.

As illustrated in FIG. 15, a laminated film composed of conductive film 27, conductive film 28 and mask film 29 is patterned into a linear shape to form bit line 30 composed of conductive film 27 and conductive film 28. Both width Y7 and pitch Y8 of bit lines 30 are set to 50 nm. Note that hereinafter, each bit line 30 may be referred to as a bit line being inclusive of mask film 29 left over on the upper surface of the bit line 30, in some cases. Each bit line 30 is formed as a pattern extending in the X direction intersecting with buried word lines 23. In FIG. 1, bit lines 30 are shown as having a linear shape perpendicular to buried word lines 23. Alternatively, however, bit lines 30 may be disposed as bit lines having a partially curved shape. Conductive film 27 and impurity-diffused layer 26 (one of the source/drain regions) composing the lower layer of each bit line 30 are connected to each other in a surface part of silicon substrate 1 exposed inside bit contact opening 25.

Figure 16:
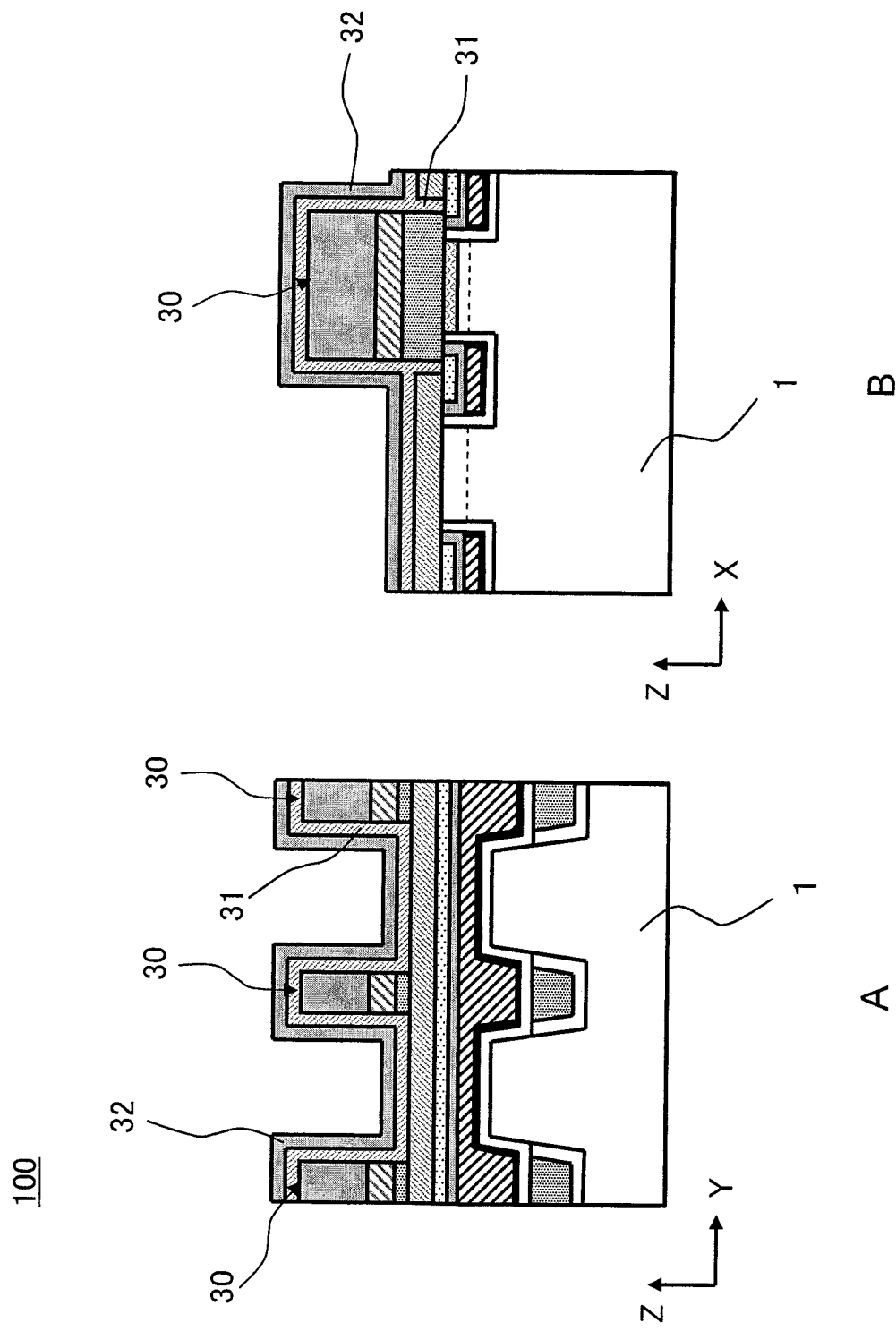
FIGS. 16A and 16B are cross-sectional views illustrating one step of the method for manufacturing the semiconductor device illustrated in FIGS. 1 and 2.

As illustrated in FIG. 16, insulating film 31 which is a silicon nitride film formed by a thermal CVD method is formed so as to cover the side surfaces of each bit line 30. Thereafter, liner film 32 which is a silicon nitride film or the like formed by a thermal CVD method is formed so as to cover the upper surface of insulating film 31.

Figure 17:
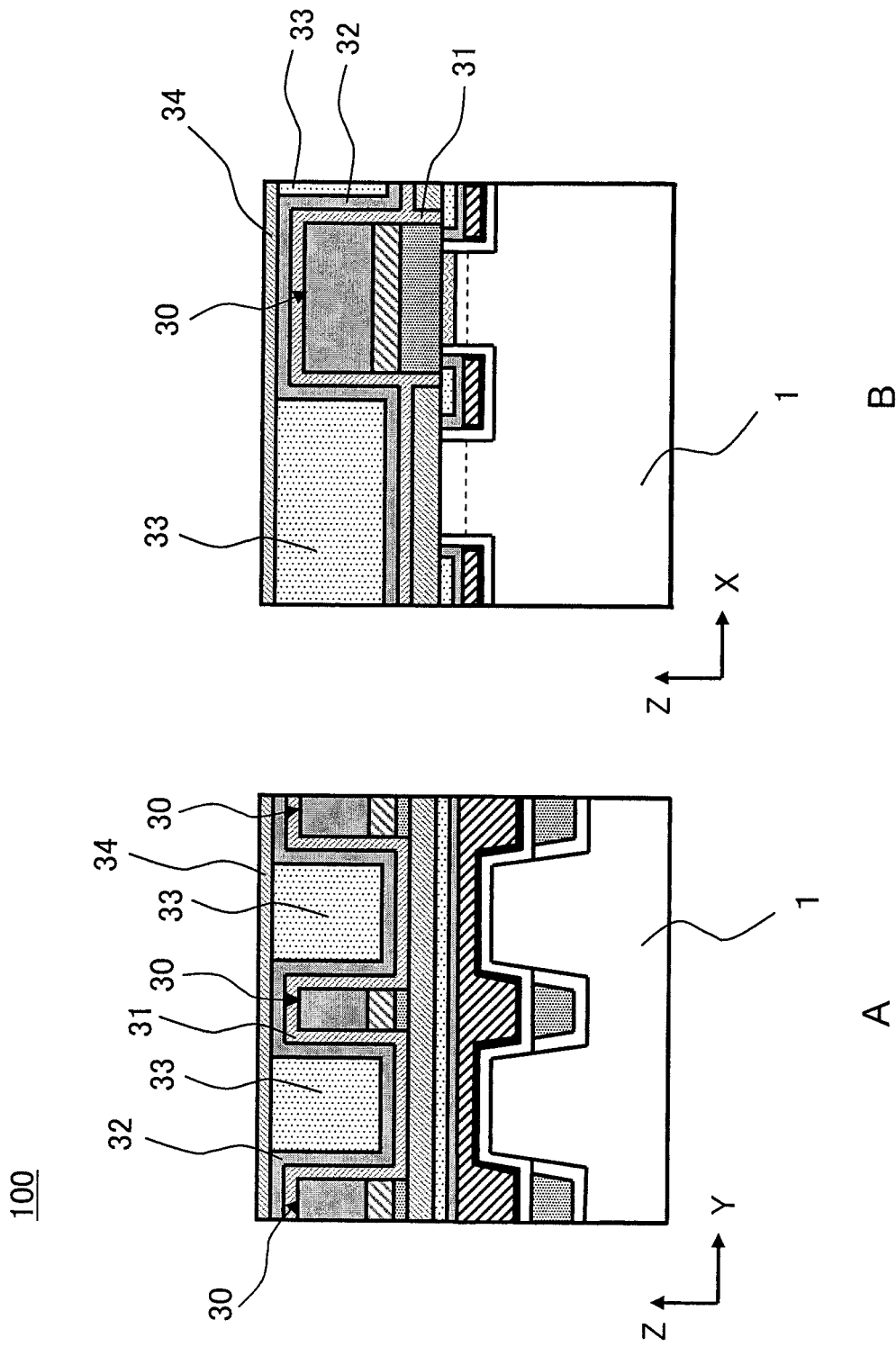
FIGS. 17A and 17B are cross-sectional views illustrating one step of the method for manufacturing the semiconductor device illustrated in FIGS. 1 and 2.

As illustrated in FIG. 17, SOD film 33 which is a coated film is deposited so as to fill the space between adjacent bit lines 30. Thereafter, the SOD film is annealing-treated in a high-temperature steam ($H_2O$) atmosphere and reformed into a solid-state film. Next, SOD film 33 is removed by a CMP method until the upper surface of liner film 32 becomes exposed. Thereafter, second interlayer insulating film 34 which is a silicon oxide film formed by a plasma CVD method is formed to cover the surface of SOD film 33.

Figure 18:
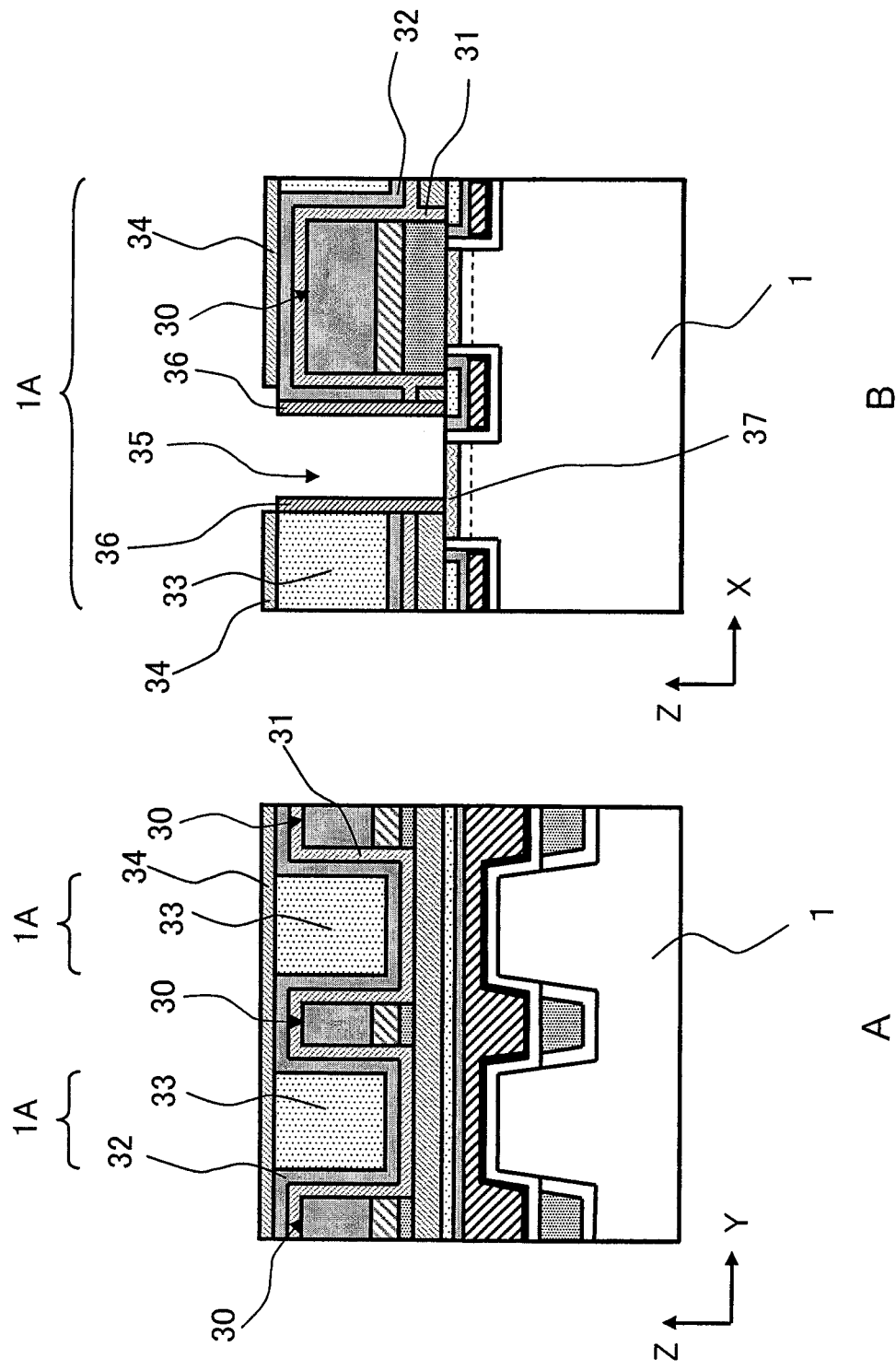
FIGS. 18A and 18B are cross-sectional views illustrating one step of the method for manufacturing the semiconductor device illustrated in FIGS. 1 and 2.

As illustrated in FIG. 18, capacitor contact opening 35 penetrating through second interlayer insulating film 34 and SOD film 33 is formed using photolithographic and dry etching methods. Here, capacitor contact opening 35 is formed by an SAC (Self Alignment Contact) method using above-mentioned insulating film 31 and liner film 32 formed on the side surfaces of each bit line 30 as sidewalls. The surface of silicon substrate 1 is exposed in an area where capacitor contact opening 35 and active region 1A overlap with each other. A silicon nitride film formed by a thermal CVD method is formed so as to cover the inner wall of capacitor contact opening 35. Then, the silicon nitride film is etched back to form sidewall (SW) insulating film 36 on the side surfaces of capacitor contact opening 35. After the formation of sidewall insulating film 36, an N-type impurity (phosphorous or the like) is ion-implanted into silicon substrate 1 to form N-type impurity-diffused layer 37 in the vicinity of the surface of silicon substrate 1. N-type impurity-diffused layer 37 thus formed functions as the source/drain regions of a transistor.

Figure 19:
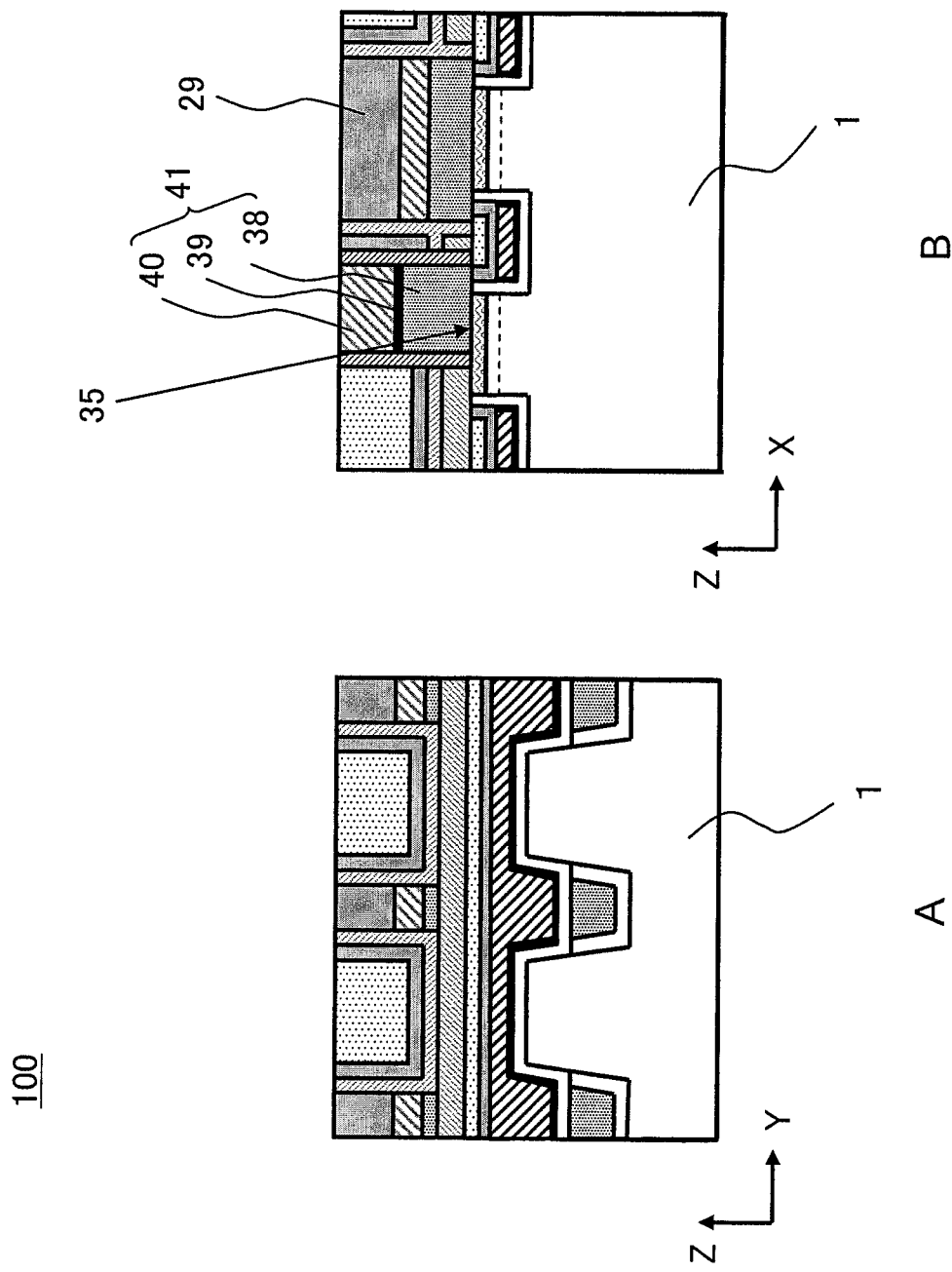
FIGS. 19A and 19B are cross-sectional views illustrating one step of the method for manufacturing the semiconductor device illustrated in FIGS. 1 and 2.

As illustrated in FIG. 19, a polysilicon film in which phosphorous is contained by a thermal CVD method is deposited on the inner side of contact opening 35. Thereafter, the polysilicon film is etched back to leave over conductive film 38 which is a polysilicon film on the bottom of capacitor contact opening 35. Thereafter, interposer layer 39 which is a cobalt silicide (CoSi) layer is formed on the upper surface of conductive film 38 by a sputtering method. Then, conductive film 40 which is a tungsten film is deposited by a CVD method, so as to fill capacitor contact opening 35. Next, conductive film 40, second interlayer insulating film 34, liner film 32 and insulating film 31 are removed by a CMP method until the surface of mask film 29 becomes exposed, thereby leaving over conductive film 40 only within capacitor contact opening 35. Consequently, there is formed capacitor contact plug 41 composed of laminated conductive film 38, interposer layer 39 and conductive film 40.

Figure 20:
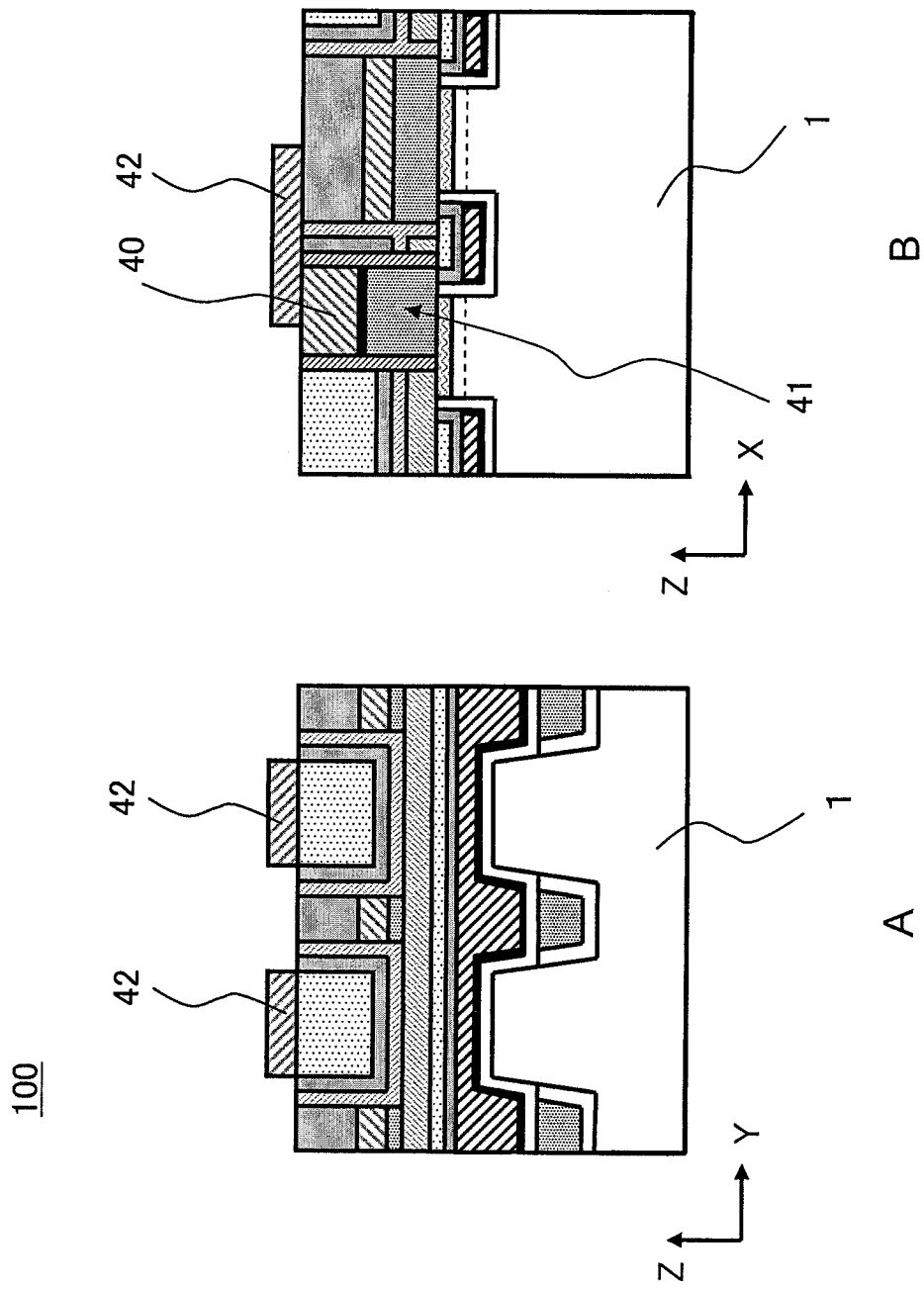
FIGS. 20A and 20B are cross-sectional views illustrating one step of the method for manufacturing the semiconductor device illustrated in FIGS. 1 and 2.

As illustrated in FIG. 20, a laminated film in which tungsten nitride (WN) and tungsten (W) are deposited in order is formed on the upper surface of silicon substrate (wafer) 1 by a sputtering method. Next, the laminated film is patterned using photolithographic and dry etching methods to form capacitor contact pad 42. Here, capacitor contact pad 42 is connected to conductive film 40 composing capacitor contact plug 41.

Figure 21:
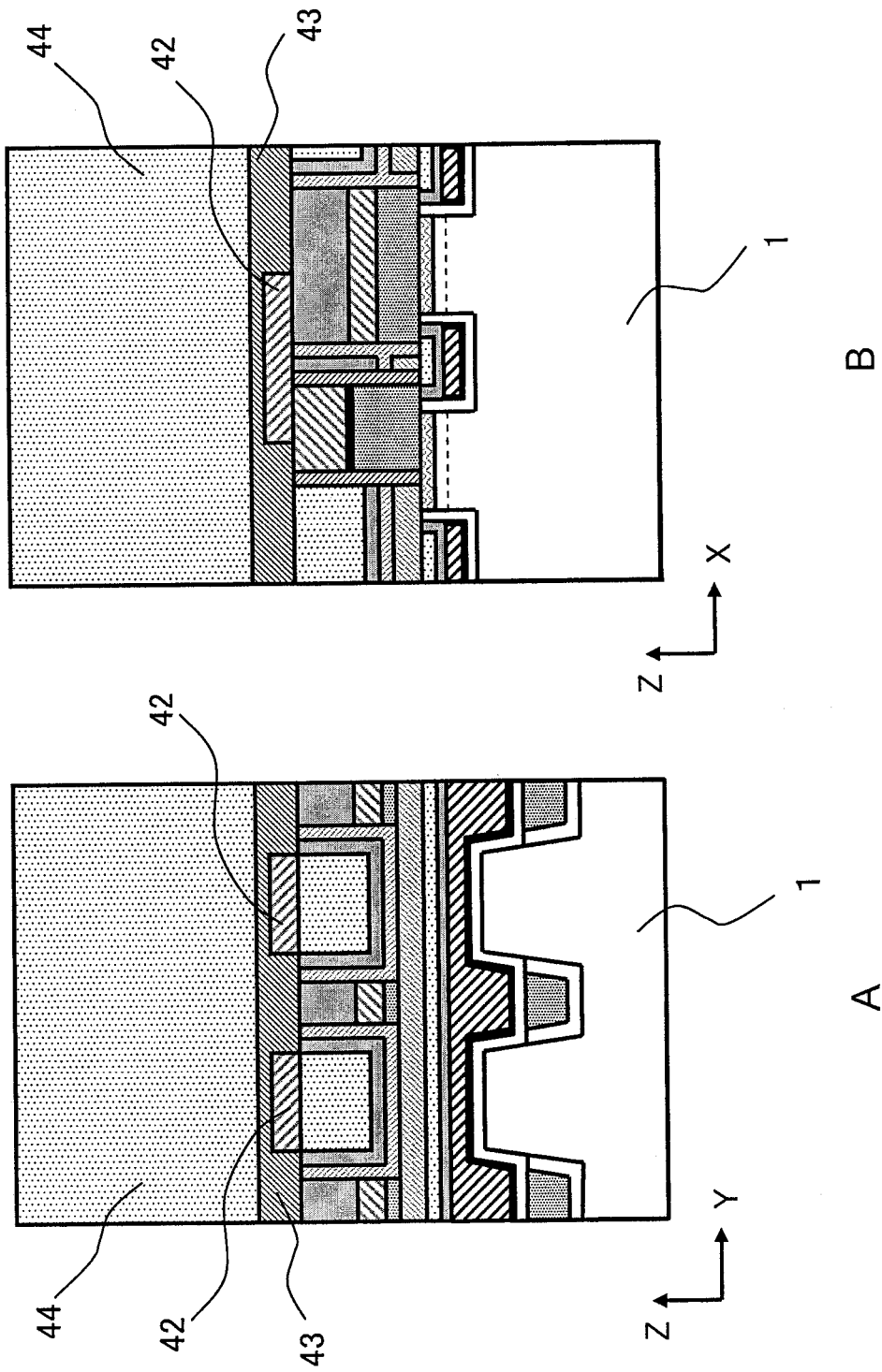
FIGS. 21A and 21B are cross-sectional views illustrating one step of the method for manufacturing the semiconductor device illustrated in FIGS. 1 and 2.

As illustrated in FIG. 21, stopper film 43 which is a silicon nitride film formed by a thermal CVD method is formed so as to cover the upper surface of each capacitor contact pad 42. Thereafter, third interlayer insulating film 44 which is a silicon oxide film formed by a plasma CVD method is formed on stopper film 43.

Figure 22:
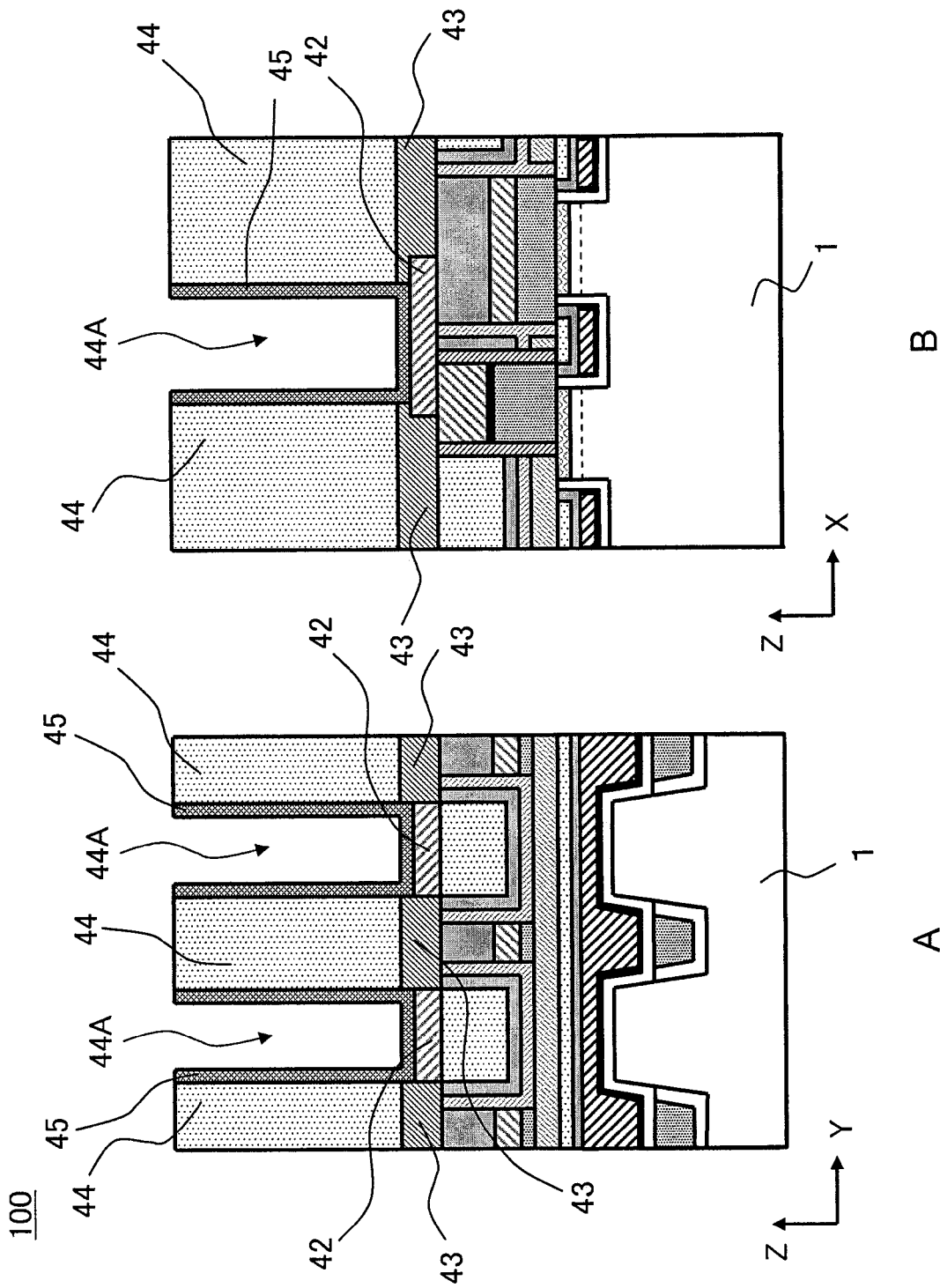
FIGS. 22A and 22B are cross-sectional views illustrating one step of the method for manufacturing the semiconductor device illustrated in FIGS. 1 and 2.

As illustrated in FIG. 22, cylinder hole 44A penetrating through third interlayer insulating film 44 and stopper film 43 is formed using photolithographic and dry etching methods, so as to expose at least part of the upper surface of capacitor contact pad 42. Next, lower electrode 45 of a capacitor is formed by a CVD method using titanium nitride, so as to cover the inner wall of cylinder hole 44A. The lower surface of lower electrode 45 on the bottom of cylinder hole 44A is connected to capacitor contact pad 42.

Figure 23:
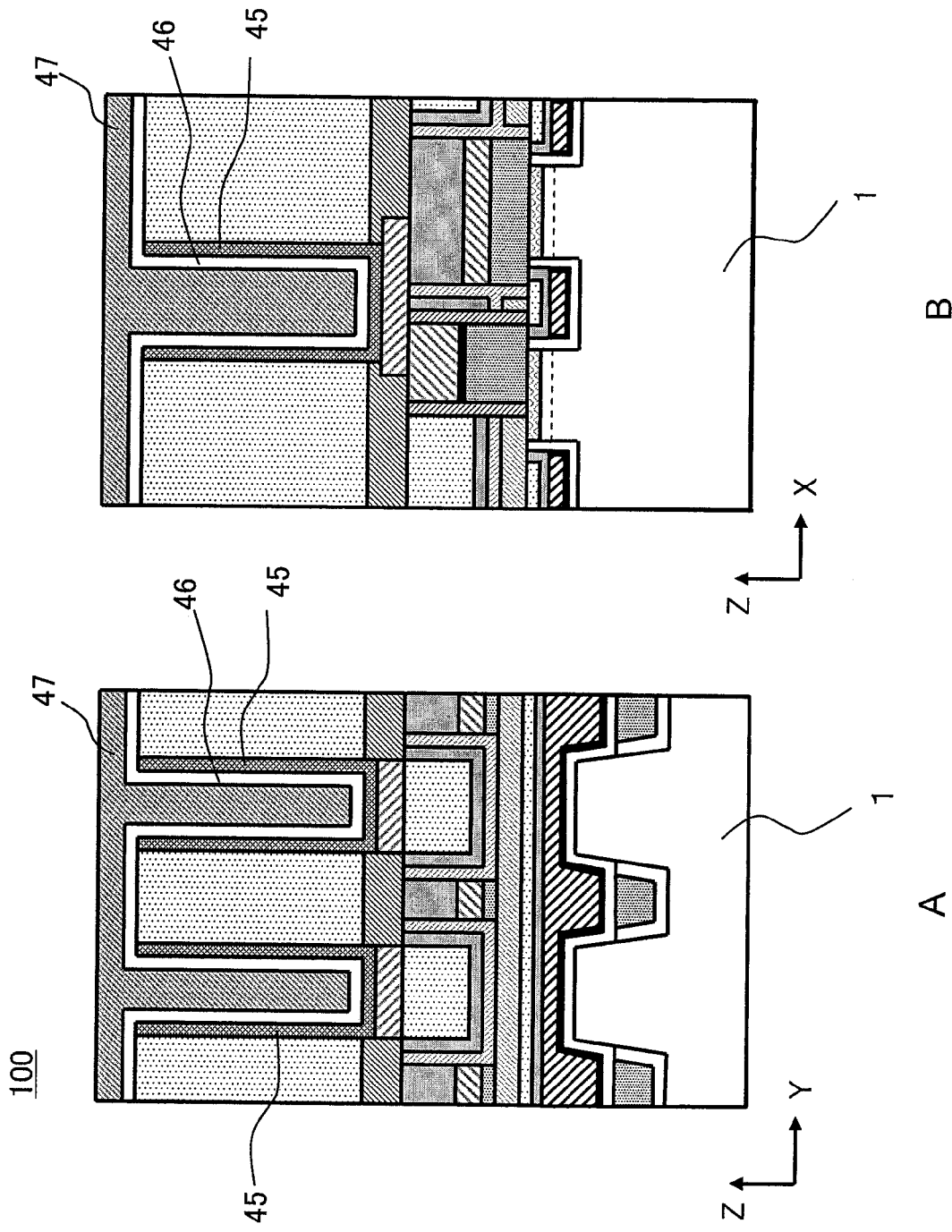
FIGS. 23A and 23B are cross-sectional views illustrating one step of the method for manufacturing the semiconductor device illustrated in FIGS. 1 and 2.

As illustrated in FIG. 23, capacitor insulating film 46 is formed by an ALD (Atomic Layer Deposition) method so as to cover the surface of lower electrode 45. Thereafter, upper electrode 47 of a capacitor which is a titanium nitride formed by a CVD method is formed. Here, as capacitor insulating film 46, it is possible to use a zirconium oxide ($ZrO_2$) film, an aluminum oxide ($Al_2O_3$) film, a hafnium oxide ($HfO_2$) film, or a laminated film thereof.

Figure 24:
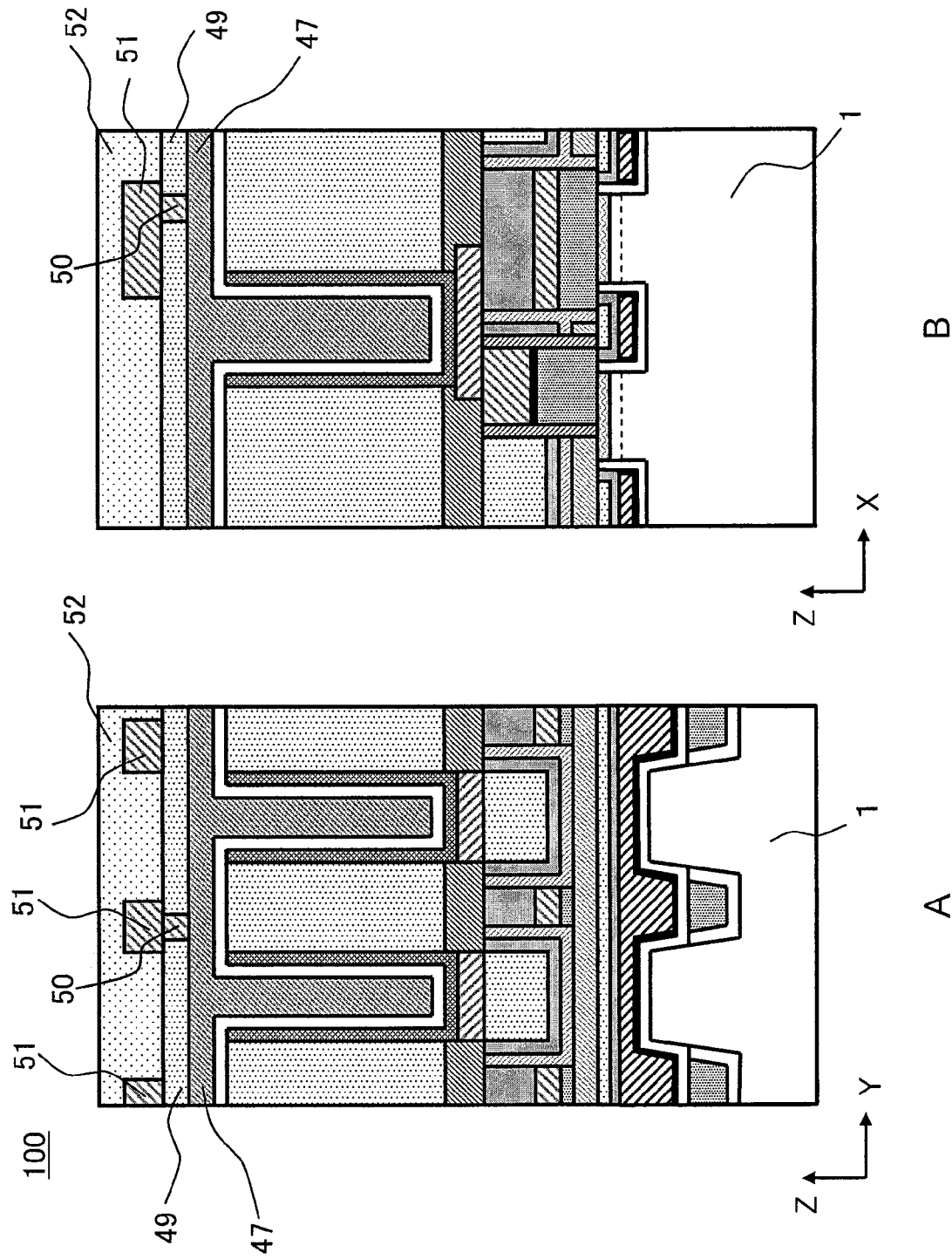
FIGS. 24A and 24B are cross-sectional views illustrating one step of the method for manufacturing the semiconductor device illustrated in FIGS. 1 and 2.

As illustrated in FIG. 24, fourth interlayer insulating film 49 which is a silicon oxide film formed by a plasma CVD method is formed so as to cover upper electrode 47. Thereafter, using photolithographic and dry etching methods, a contact hole (not illustrated) is formed in fourth interlayer insulating film 49. Next, the contact hole is filled with tungsten by a CVD method. Then, surplus tungsten on the upper surface of fourth interlayer insulating film 49 is removed by a CMP method to form contact plug 50. Next, aluminum (Al), copper (Cu) or the like is film-formed on the upper surface of fourth interlayer insulating film 49, and then the film is patterned to form upper metal wiring 51. At this time, upper metal wiring 51 is connected to upper electrode 47 through contact plug 50. Thereafter, protective film 52 is formed so as to cover upper metal wiring 51, thereby completing the memory cells of DRAM 100.

It is apparent that the present invention is not limited to the above embodiments, but may be modified and changed without departing from the scope and spirit of the invention.

What is claimed is:

1. A semiconductor device comprising:
a memory cell region including a first isolation region, and a first active region provided so as to be divided off by the first isolation region;
a peripheral region including a second isolation region, and a second active region divided off by the first and second isolation regions, the second active region being formed as a plurality of parallelogram-shaped unit patterns arranged adjacent to each other in a first direction, adjoining sides of the parallelogram-shaped unit patterns being offset from each other, other sides of the parallelogram-shaped unit patterns being parallel to each other in a second direction having an acute angle with respect to the first direction; and
a first wiring buried in portions of a semiconductor substrate within the memory cell region and the peripheral region, so as to extend over the first and second active regions in a third direction perpendicular to the first direction.

2. The semiconductor device according to claim 1, wherein the first active region extends in the second direction intersecting with the first direction.

3. The semiconductor device according to claim 2, wherein the semiconductor device comprises a plurality of the first active regions disposed parallel to each other in the second direction.

4. The semiconductor device according to claim 1, wherein a shortest distance between the first and second active regions in the first direction is the same.

5. The semiconductor device according to claim 1, wherein the second active region has a convex shape protruding portion in which a central part of the protruding portion is higher than a peripheral part of the protruding portion when viewed from a bottom surface of the semiconductor substrate.

6. The semiconductor device according to claim 5, wherein the central part of the protruding portion has a substantially uniform height.

7. The semiconductor device according to claim 5, wherein the protruding portion is larger in height than an upper surface of the first active region when viewed from the bottom surface of the semiconductor substrate.

8. The semiconductor device according to claim 1, wherein the first wiring is a word line.

9. The semiconductor device according to claim 8, wherein the word line contains titanium nitride and tungsten.

10. The semiconductor device according to claim 1, wherein the insulating film includes a silicon nitride film and a silicon oxide film.

11. A semiconductor device comprising:
a memory cell region including a first isolation region, and a first active region provided so as to be divided off by the first isolation region;
a peripheral region including a second isolation region, and a second active region, the second active region being formed as a plurality of parallelogram-shaped unit patterns arranged adjacent to each other in a first direction, adjoining sides of the parallelogram-shaped unit patterns being offset from each other, other sides of the parallelogram-shaped unit patterns being parallel to each other in a second direction having an acute angle with respect to the first direction; and
a first wiring buried in portions of a semiconductor substrate within the memory cell region and the peripheral region, so as to extend over the first and second active regions in a third direction perpendicular to the first direction,
wherein the second active region is arranged so as to have contact with the first and second isolation regions through part of a side surface of the second active region and so as to surround the memory cell region.

12. The semiconductor device according to claim 11, wherein the first wiring is a word line.

13. The semiconductor device according to claim 11, wherein a shortest distance between the first and second active regions in the first direction is the same.

14. A semiconductor device comprising:
a memory cell region including a plurality of cell isolation regions which are provided in a semiconductor substrate and extend in a second direction, the cell isolation regions being formed by burying an insulating film in the semiconductor substrate, and a plurality of cell active regions divided off by the plurality of cell isolation regions and extending in the second direction;
a peripheral region including a peripheral active region surrounding the memory cell region, and a peripheral isolation region arranged in contact with the peripheral active region outside the memory cell region, the peripheral active region being formed as a plurality of parallelogram-shaped unit patterns arranged adjacent to each other in a first direction, adjoining sides of the parallelogram-shaped unit patterns being offset from each other, other sides of the parallelogram-shaped unit patterns being parallel to each other in a second direction having an acute angle with respect to the first direction; and
a plurality of buried word lines which intersect with the plurality of cell active regions and the peripheral active region and extend in a third direction perpendicular to the first direction, the plurality of buried word lines being formed by burying a metal layer in the semiconductor substrate,
wherein
a plan-view area of a region in which each of the buried word lines and the peripheral active region intersect with each other is larger than a plan-view area of a region in which each of the buried word lines and each of the plurality of cell active regions intersect with each other.

15. The semiconductor device according to claim 14,
wherein a shortest distance in the first direction between each corresponding one of the plurality of cell active regions and the peripheral active region is the same.

16. The semiconductor device according to claim 14,
wherein a height of an upper surface of the peripheral active region is substantially uniform when viewed from a bottom surface of the semiconductor substrate.

* * * * *